United States Patent
Sakamoto et al.

(10) Patent No.: US 9,911,749 B2
(45) Date of Patent: Mar. 6, 2018

(54) STACKED 3D SEMICONDUCTOR MEMORY STRUCTURE

(71) Applicant: Toshiba Memory Corporation, Minato-ku (JP)

(72) Inventors: Kei Sakamoto, Nagoya (JP); Hiroshi Nakaki, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/976,643

(22) Filed: Dec. 21, 2015

(65) Prior Publication Data

US 2017/0069651 A1    Mar. 9, 2017

Related U.S. Application Data

(60) Provisional application No. 62/216,183, filed on Sep. 9, 2015.

(51) Int. Cl.

| H01L 23/528 | (2006.01) |
|---|---|
| H01L 27/115 | (2017.01) |
| H01L 29/792 | (2006.01) |
| H01L 21/28 | (2006.01) |
| H01L 27/11582 | (2017.01) |
| H01L 27/11573 | (2017.01) |
| H01L 27/11563 | (2017.01) |
| H01L 27/11565 | (2017.01) |
| H01L 27/11575 | (2017.01) |
| H01L 21/768 | (2006.01) |
| G11C 16/04 | (2006.01) |
| H01L 27/1157 | (2017.01) |

(52) U.S. Cl.
CPC .. *H01L 27/11582* (2013.01); *H01L 21/28273* (2013.01); *H01L 27/11563* (2013.01); *H01L 27/11565* (2013.01); *H01L 27/11573* (2013.01); *H01L 27/11575* (2013.01); *G11C 16/0466* (2013.01); *H01L 27/1157* (2013.01)

(58) Field of Classification Search
CPC ......... H01L 27/11582; H01L 27/11578; H01L 29/7926; H01L 27/11556
See application file for complete search history.

(56) References Cited

U.S. PATENT DOCUMENTS

| 8,513,731 B2 | 8/2013 | Lee et al. |
| 8,564,050 B2 | 10/2013 | Park et al. |

(Continued)

FOREIGN PATENT DOCUMENTS

JP    2007-266143 A    10/2007

*Primary Examiner* — Victor A Mandala
*Assistant Examiner* — Regan J Rundio
(74) *Attorney, Agent, or Firm* — Oblon, McClelland, Maier & Neustadt, L.L.P.

(57) ABSTRACT

According to one embodiment, a semiconductor memory device includes a substrate; a stacked body provided on the substrate and including a plurality of electrode layers; a semiconductor film; a charge storage film; an interconnect layer provided in the stacked body, the interconnect layer; a first contact portion; a first metal layer; and a second metal layer. The interconnect layer includes: a first portion including silicon; and a second portion provided on the first portion and including metal. The first metal layer is provided on the first contact portion. The second metal layer is provided on the first metal layer, and electrically connected to the interconnect layer.

9 Claims, 21 Drawing Sheets

(56) References Cited

U.S. PATENT DOCUMENTS

| | | |
|---|---|---|
| 9,099,349 B2 | 8/2015 | Kofuji et al. |
| 2007/0252201 A1 | 11/2007 | Kito et al. |
| 2009/0242968 A1* | 10/2009 | Maeda .............. H01L 27/11551 |
| | | 257/324 |
| 2011/0284947 A1 | 11/2011 | Kito et al. |
| 2011/0287597 A1 | 11/2011 | Kito et al. |
| 2015/0179662 A1* | 6/2015 | Makala ............. H01L 27/11582 |
| | | 257/314 |
| 2015/0372006 A1 | 12/2015 | Kito et al. |
| 2016/0329343 A1* | 11/2016 | Pachamuthu ..... H01L 27/11582 |

\* cited by examiner

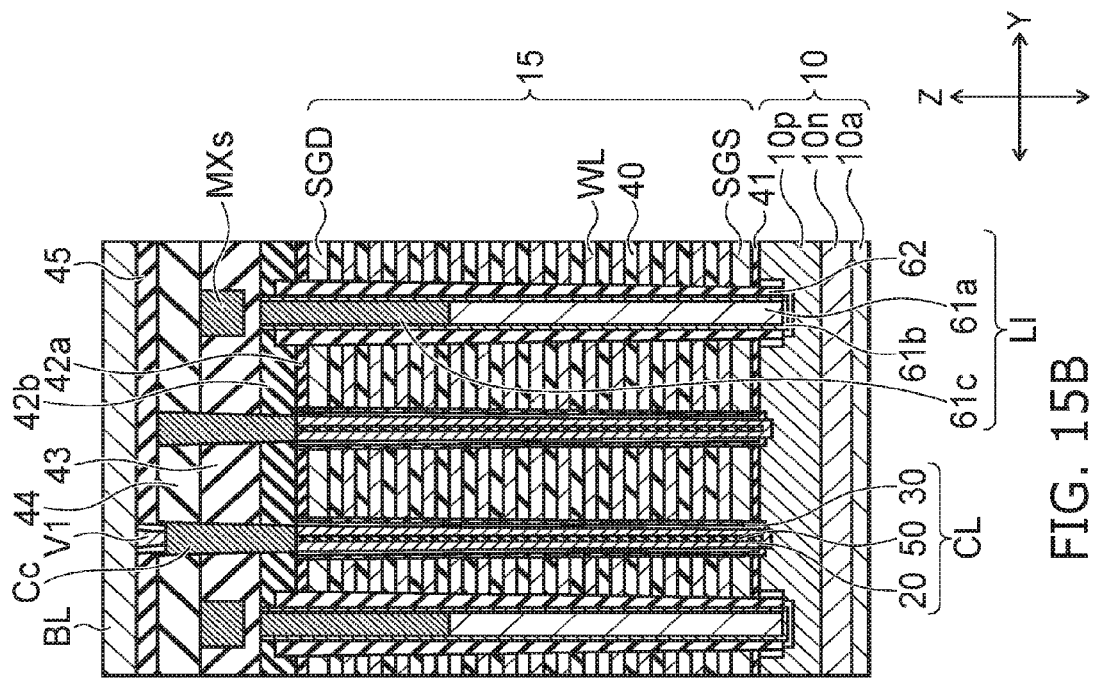
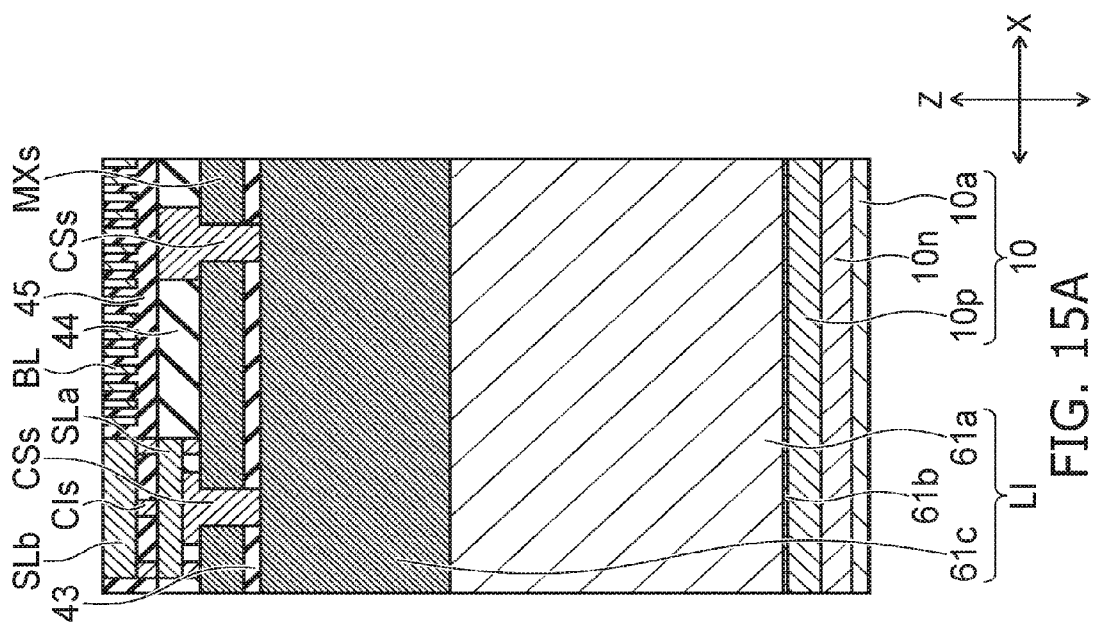
FIG. 15A
FIG. 15B

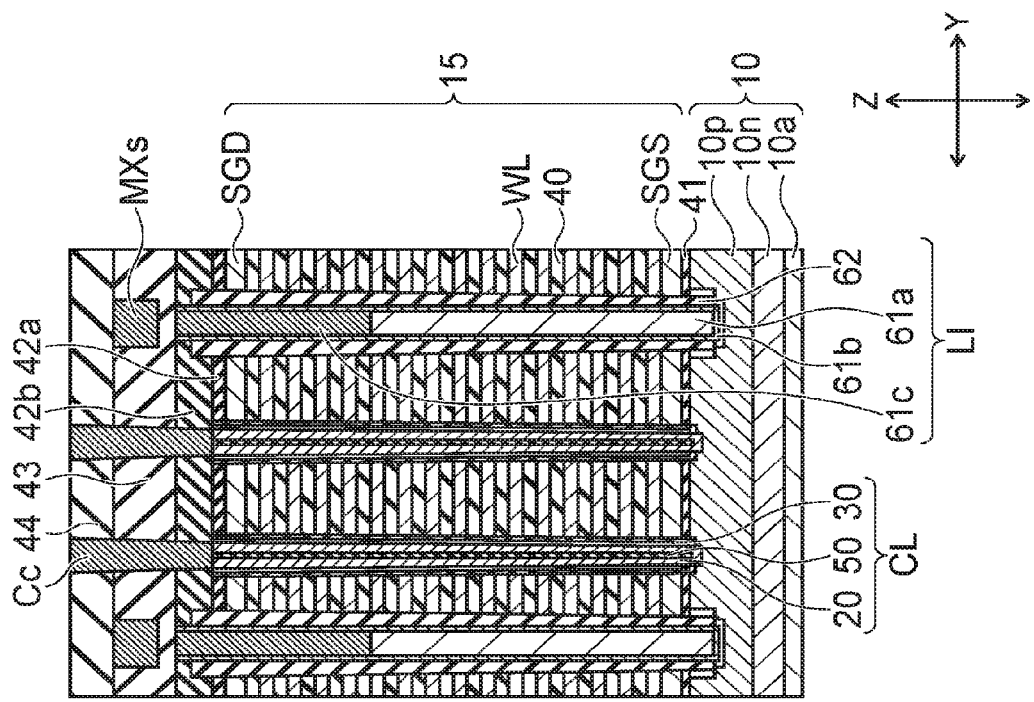
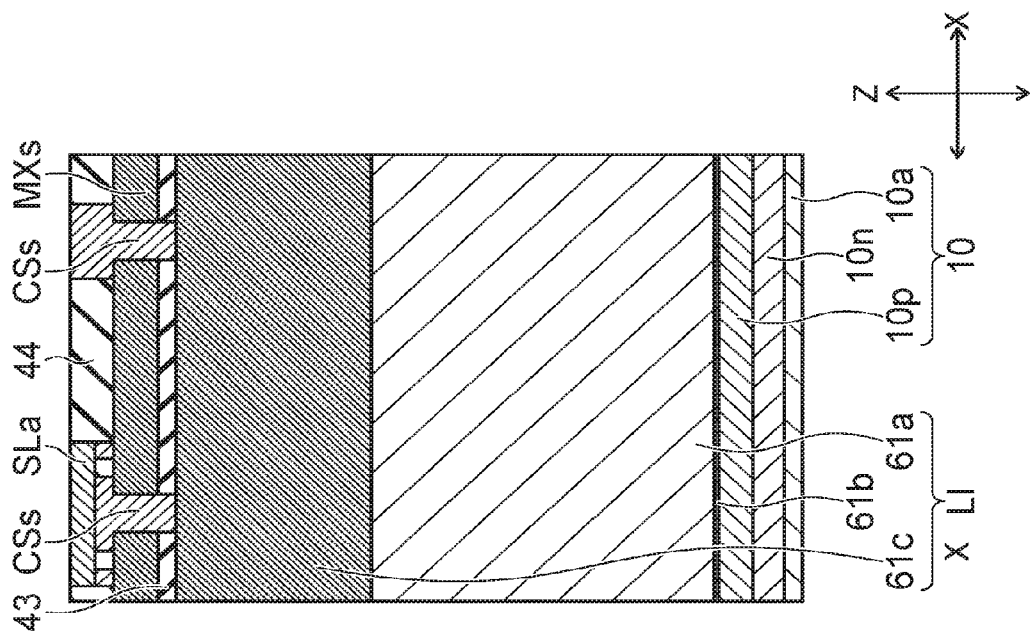
FIG. 19A
FIG. 19B

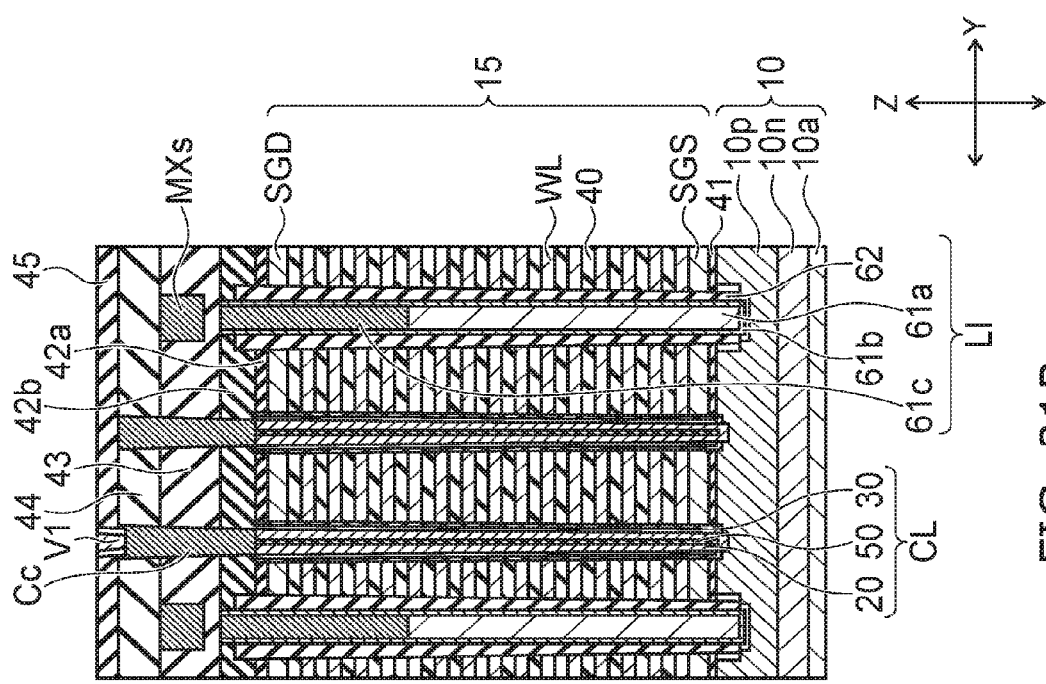
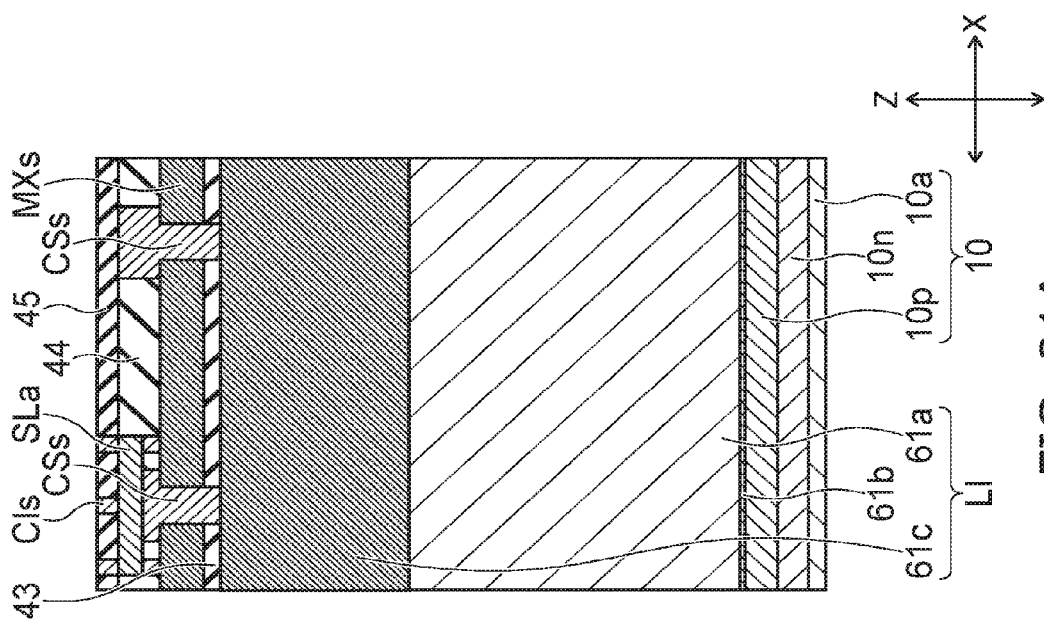

STACKED 3D SEMICONDUCTOR MEMORY STRUCTURE

CROSS-REFERENCE TO RELATED APPLICATIONS

This application is based upon and claims the benefit of priority from U.S. Provisional Patent Application 62/216,183 field on Sep. 9, 2015; the entire contents of which are incorporated herein by reference.

FIELD

Embodiments described herein relate generally to a semiconductor memory device.

BACKGROUND

A memory device with a three dimensional structure has been proposed in which a memory hole is formed in a stacked body in which a plurality of electrode layers that function as a control gate in a memory cell is stacked with each layer separated from each other, and a silicon body serving as a channel is provided on a side wall of the memory hole with a charge storage film interposed therebetween.

There is a concern over degradation of the device when the number of layers of the stacked body increases.

BRIEF DESCRIPTION OF THE DRAWINGS

FIG. 15A and FIG. 15B are schematic cross-sectional view of the semiconductor memory device of the second embodiment; and FIG. 16 to FIG. 21B are schematic views showing a method for manufacturing the semiconductor memory device of the second embodiment.

DETAILED DESCRIPTION

Figure 1:
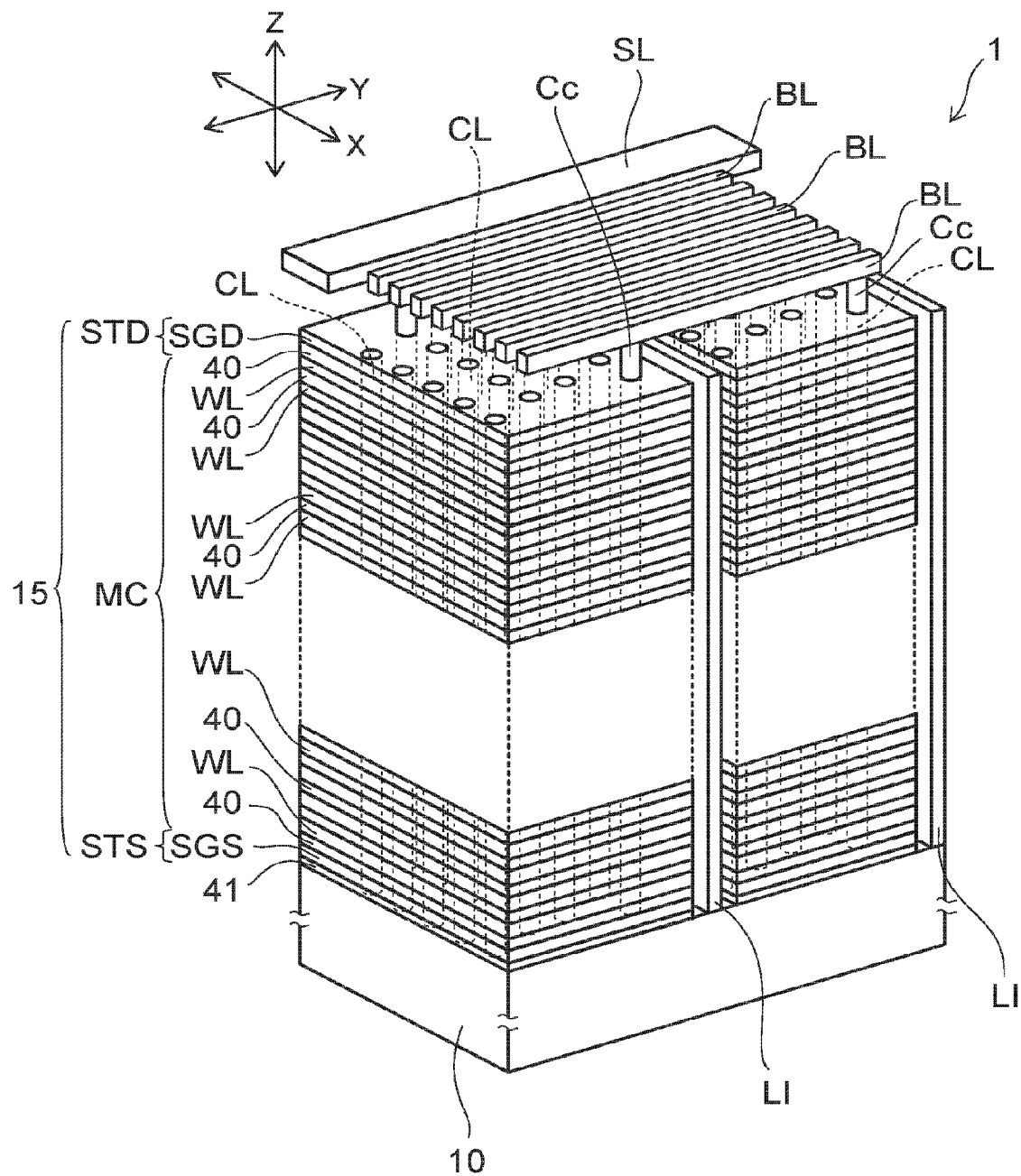
FIG. 1 is a schematic perspective view of a memory cell array of first embodiment.

According to one embodiment, a semiconductor memory device includes a substrate; a stacked body provided on the substrate and including a plurality of electrode layers separately stacked each other; a semiconductor film provided in the stacked body and extending in a stacking direction of the stacked body, the semiconductor film electrically connected to the substrate; a charge storage film provided in the stacked body, the charge storage film provided between the plurality of electrode layers and the semiconductor film; an interconnect layer provided in the stacked body, the interconnect layer extending in the stacking direction and in a first direction crossing the stacking direction, and electrically connected to the semiconductor film via the substrate; a first contact portion provided on the stacked body, and electrically connected to the interconnect layer; a first metal layer; and a second metal layer. The interconnect layer includes: a first portion including silicon; and a second portion provided on the first portion and including metal. The first metal layer is provided on the first contact portion and extends in the first direction, the first metal layer is electrically connected to the interconnect layer via the first contact portion. The second metal layer is provided on the first metal layer, and electrically connected to the interconnect layer.

Hereinafter, embodiments will be described with reference to the drawings. In the drawings, the same elements are denoted by the same reference sign.

First Embodiment

Referring to FIG. 1, an example of the configuration of a memory cell array 1 according to this embodiment is described.

FIG. 1 is a schematic perspective view of the memory cell array 1 of this embodiment. In FIG. 1, insulating layers between electrode layers, and the like are omitted for ease of understanding of the drawing.

In FIG. 1, two directions perpendicular to each other are defined as the X-direction (first direction) and the Y-direction (second direction), and the direction perpendicular to both the X-direction and the Y-direction (XY plane) in which a plurality of electrode layers WL is stacked is defined as the Z-direction (stacking direction).

As illustrated in FIG. 1, the memory cell array 1 includes a substrate 10, a stacked body 15, a plurality of columnar portions CL, an interconnect layer LI, and upper layer interconnect. In FIG. 1, bit lines BL and a source layer SL are illustrated as the upper layer interconnect.

The stacked body 15 is provided on the substrate 10 with an insulating layer 41 provided therebetween. The stacked body 15 includes a source-side select gate SGS, a drain-side select gate SGD, a plurality of electrode layers WL, and a plurality of insulating layers 40.

The source-side select gate SGS is provided as the lowermost layer of the stacked body 15. The drain-side select gate SGD is provided as the uppermost layer of the stacked body 15.

The plurality of electrode layers WL is stacked separated with each layer from each other. The plurality of insulating layers 40 having for example an air gap is provided between the plurality of electrode layers WL. The number of layers of the electrode layer WL illustrated on the drawings is an example, and the number of layers of the electrode layer WL is optional.

The electrode layer WL includes a metal. The electrode layer WL includes for example at least any of tungsten, molybdenum, titanium nitride, and tungsten nitride, and may include silicon or a metal silicide. The source-side select gate SGS and the drain-side select gate SGD include the same material as the electrode layers WL. The insulating layers 40 include for example a silicon oxide film.

The drain-side select gate SGD and the source-side select gate SGS are thicker than, for example, a single electrode layer WL, and pluralities of drain-side select gates SGD and source-side select gates SGS may be provided. Incidentally, the thickness of the drain-side select gate SGD and the thickness of the source-side select gate SGS may be equal or less than the thickness of one electrode layer WL, and, in this case, also pluralities of drain-side select gates SGD and source-side select gates SGS may be provided, as described above. Note that here the "thickness" indicates the thickness in the stacking direction of the stacked body 15 (Z-direction).

A plurality of columnar portions CL extending in the Z-direction is provided in the stacked body 15. The columnar portion CL is provided in a cylindrical pillar shape or an elliptical pillar shape, for example. The plurality of columnar portions CL is provided in a staggered arrangement, for example. Alternatively, the plurality of columnar portions CL may be provided in a square lattice arrangement along the X direction and the Y direction. The columnar portion CL is electrically connected with the substrate 10.

Figure 2:
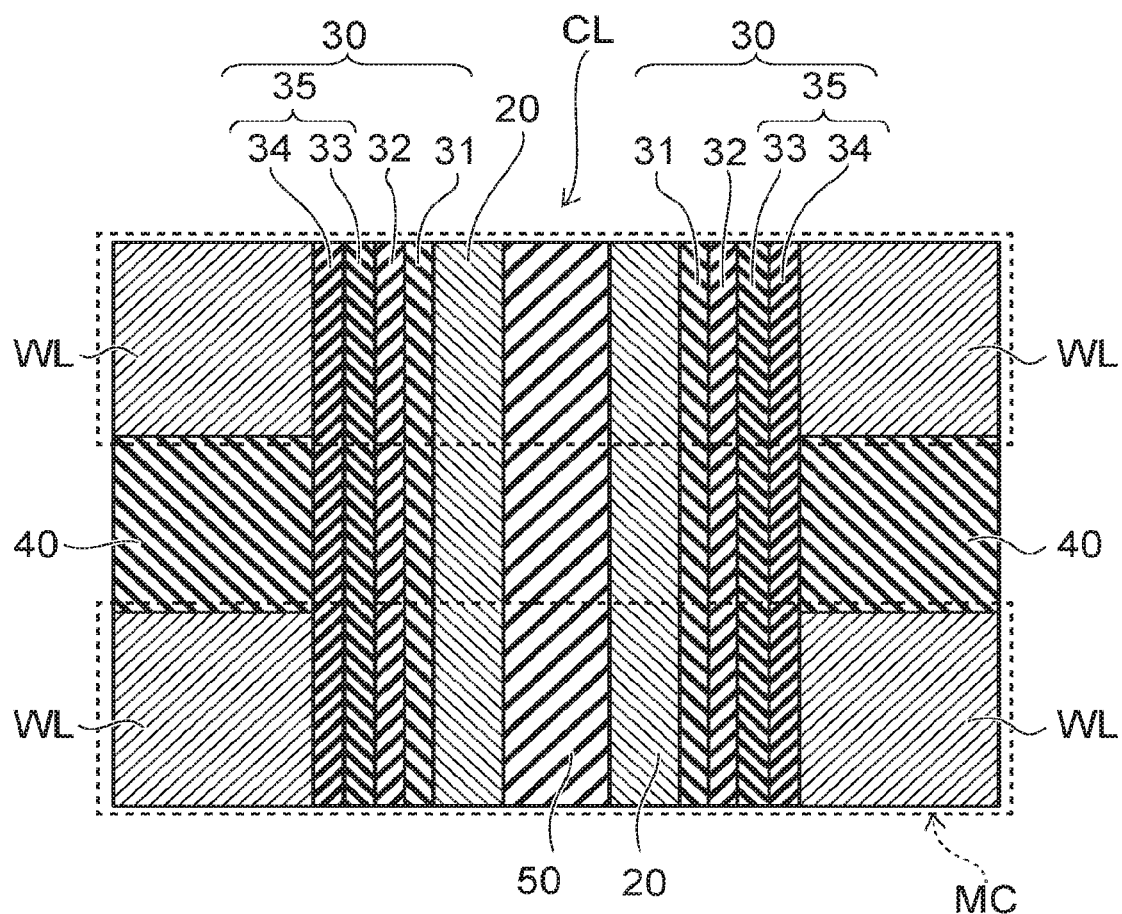
FIG. 2 is an enlarged schematic cross-sectional view of a part of the semiconductor memory device of the first embodiment.

The columnar portion CL includes a channel body 20, a memory film 30, and a core insulating film 50, as illustrated in FIG. 2. The memory film 30 is provided between the stacked body 15 and the channel body 20. The memory film 30 and the channel body 20 extend in the Z-direction.

The core insulating film 50 is provided on the inner side of the channel body 20. Note that the channel body 20 may have a prismatic shape, for example. The core insulating film 50 for example need not be provided on the inner side of the channel body 20.

The channel body 20 is for example, a silicon film that contains silicon as the major component. The core insulating film 50 includes a silicon oxide film, for example, and may include an air gap.

Within the stacked body 15, the interconnect layer LI is provided extending in the X-direction and the Z-direction in the stacked body 15. The interconnect layer LI is sandwiched between stacked bodies 15. The detailed configuration of the interconnect layer LI is described later.

Figure 3:
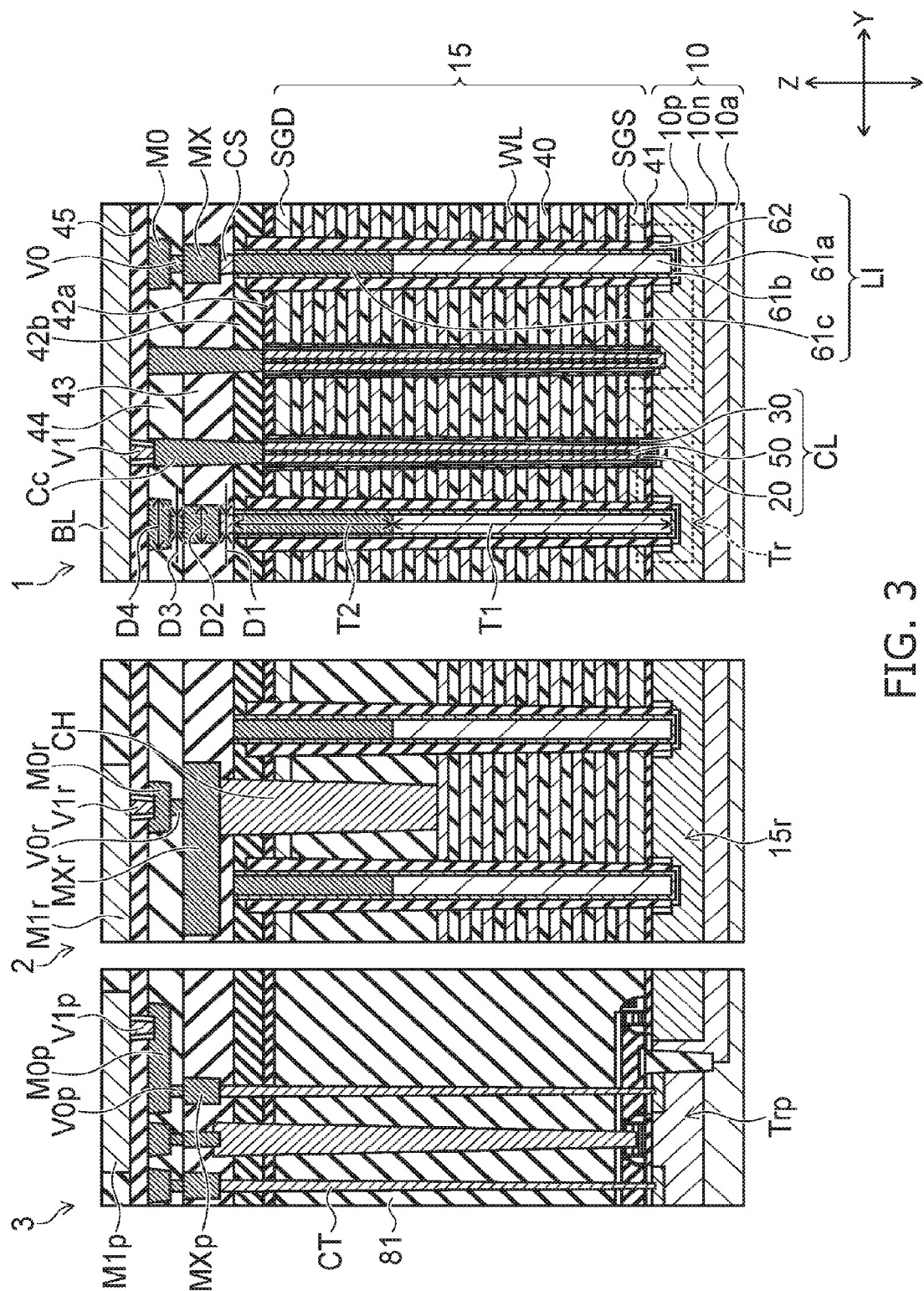
FIG. 3 is a schematic cross-sectional view of the semiconductor memory device of the first embodiment.

A lower end of the interconnect layer LI may be electrically connected to the channel body 20 (semiconductor film) in the columnar portion CL via a transistor Tr formed in the substrate 10 (see FIG. 3). For example, the transistor Tr in the substrate 10 uses the source side selection gate SGS as a gate electrode, and uses the substrate 10 as a channel. In this way, when the transistor Tr is in the on state, the interconnect layer LI is electrically connected to the channel body 20.

The interconnect layer LI is electrically connected at the upper part thereof to a control circuit (for example, a transistor Trp in FIG. 3) via the source layer SL.

The plurality of bit lines BL (third metal layer) is provided above the stacked body 15. Each of the plurality of bit lines BL is separated from each other in the X-direction, and extends in the Y-direction.

The upper end of the channel body 20 is connected to the bit line BL with a third contact part Cc and a fourth contact part V1 provided therebetween (see FIG. 3). The lower end side of the channel body 20 is connected to the substrate 10. The channel body 20 is electrically connected to the transistor Tr.

One each of the plurality of channel bodies 20 of the plurality of columnar portions CL that are selected from each of the regions that are separated in the Y-direction by the interconnect layer LI, are connected in common to one of the bit lines BL.

A drain-side select transistor STD is provided on the upper end portion of the columnar portion CL, and a source-side select transistor STS is provided on a lower end portion of the columnar portion CL.

A memory cell MC, the drain-side select transistor STD and the source-side select transistor STS are each a vertical transistor in which a current flows in the stacking direction of the stacked body 15.

Each of the select gates SGD, SGS functions as a gate electrode for each of the select transistors STD, STS, in other words, as a select gate. An insulating film that functions as a gate insulating film for each of the select transistors STD, STS is provided between the channel body 20 and each of the select gates SGD, SGS respectively.

The plurality of memory cells MC, in which the electrode layer WL of each layer functions as the control gate, is provided between the drain-side select transistor STD and the source-side select transistor STS. Each of the plurality of memory cells MC is stacked separated from each other.

Such a plurality of memory cells MC, drain-side select transistor STD, and source-side select transistor STS are connected in series via the channel body 20, and form a single memory string. The memory string is provided in a staggered arrangement, for example, in a surface direction parallel to an X-Y plane, and the plurality of memory cells MC is provided in a three-dimensional manner in the X-direction, the Y-direction, and the Z-direction.

The semiconductor memory device according to this embodiment can electrically erase and write data freely and store memory contents even after a power source is turned off.

Referring to FIG. 2, an example of the memory cell MC according to this embodiment is described.

FIG. 2 is an enlarged schematic cross-sectional view of a portion of the columnar portion CL according to this embodiment.

The memory cell MC is of a charge trap type, for example, and includes the electrode layer WL, the memory film 30, the channel body 20, and the core insulating film 50.

The channel body 20 functions as a channel in the memory cell MC, and the electrode layer WL functions as a control gate of the memory cell MC. The charge storage film 32 functions as a data memory layer in which an electric charge infused from the channel body 20 is accumulated. In other words, the memory cell MC having a control gate surrounding the channel therein is formed at the location where the channel body 20 and each of the electrode layers WL intersect.

The memory film 30 includes, for example, a block insulating film 35, the charge storage film 32, and a tunnel insulating film 31. The block insulating film 35 is in contact with the electrode layer WL. The tunnel insulating film 31 is in contact with the channel body 20. The charge storage film 32 is provided between the block insulating film 35 and the tunnel insulating film 31.

The block insulating film 35 prevents diffusion of the electric charge accumulated in the charge storage film 32 to the electrode layer WL. The block insulating film 35 includes at least any of, for example, hafnium, aluminum, zirconium, and lanthanum, and uses a material with a dielectric constant higher than that of a silicon nitride film (high dielectric oxide film: High-k film).

The block insulating film 35 includes, for example, a cap film 34 and a block film 33. The block film 33 is provided between the cap film 34 and the charge storage film 32. The block film 33 is a silicon oxide film, for example.

The cap film 34 is provided in contact with the electrode layer. A film with a higher dielectric constant than that of the block film 33 is used for the cap film 34, and includes at least any of, for example, hafnium, aluminum, zirconium, and lanthanum. For the cap film 34, at least one of a silicon nitride film and aluminum oxide is used, for example. By providing the cap film 34 in contact with the electrode layer WL, it is possible to suppress back tunneling electrons that are infused from the electrode layer WL at the time of erasing. In other words, using a stacked film made of any of the silicon oxide film, the silicon nitride film, and the high dielectric oxide film as the block insulating film 35 can enhance the electric charge blocking effect.

The charge storage film 32 has a large number of trap sites that trap the electric charge. The charge storage film 32 includes at least either of a silicon nitride film and hafnium oxide, for example.

The tunnel insulating film 31 functions as a potential barrier when an electric charge is infused from the channel body 20 into the charge storage film 32 or when the electric charge accumulated in the charge storage film 32 is diffused to the channel body 20. The tunnel insulating film 31 is a silicon oxide film, for example.

Alternatively, a stacked film, which is $SiO_2$—$Si_3N_4$—$SiO_2$ (ONO) film, which has a configuration in which a silicon nitride film interposes a pair of silicon oxide films, may also be used as the tunnel insulating film 31. If the ONO film is used as the tunnel insulating film 31, an erase operation can be performed in a low electric field when compared with a single layer of the silicon oxide film.

Next, the configuration of a portion of the semiconductor memory device of this embodiment will be described with reference to FIGS. 3 and 4.

FIG. 3 is a schematic cross-sectional view of a portion of the memory cell array 1 of this embodiment, a portion of a stairs portion 2, and a portion of a peripheral region 3. FIG. 4 is a schematic plan view with the upper surface of a second metal layer M0 of the memory cell array 1 as reference. The schematic cross-sectional view of the memory cell array 1 of FIG. 3 corresponds to A-A' of FIG. 4.

As illustrated in FIG. 3, the interconnect layer LI includes a first portion 61a, a second portion 61c, a conductive film 61b, and an insulating film 62. The first portion 61a is provided on the lower side of the interconnect layer LI. The second portion 61c is provided on the first portion 61a.

The conductive film 61b is integrally provided between the first portion 61a and the stacked body 15, and between the second portion 61c and the stacked body 15, and extends in the X-direction and the Z-direction. The conductive film 61b is integrally provided between the first portion 61a and the stacked body 15, and between the first portion 61a and the substrate 10, and is in contact with a p-type semiconductor layer 10p of the substrate 10.

The insulating film 62 is provided between the conductive film 61b and the stacked body 15, and extends in the X-direction and the Z-direction. The insulating film 62 is in contact with the stacked body 15.

Within the interconnect layer LI, the volume occupied by the first portion 61a is larger than the volume occupied by the second portion 61c. For example, in the Z-direction, the thickness T1 of the first portion 61a is thicker than the thickness T2 of the second portion 61c.

The first portion 61a includes silicon, for example, polysilicon. The second portion 61c includes a metal, for example, tungsten. The conductive film 61b has electrical conductivity, and includes, for example, titanium. The conductive film 61b includes, for example, a stacked film of a film that includes for example titanium, and a film that includes titanium nitride. The core insulating film 62 includes a silicon oxide film, for example.

Figure 13:
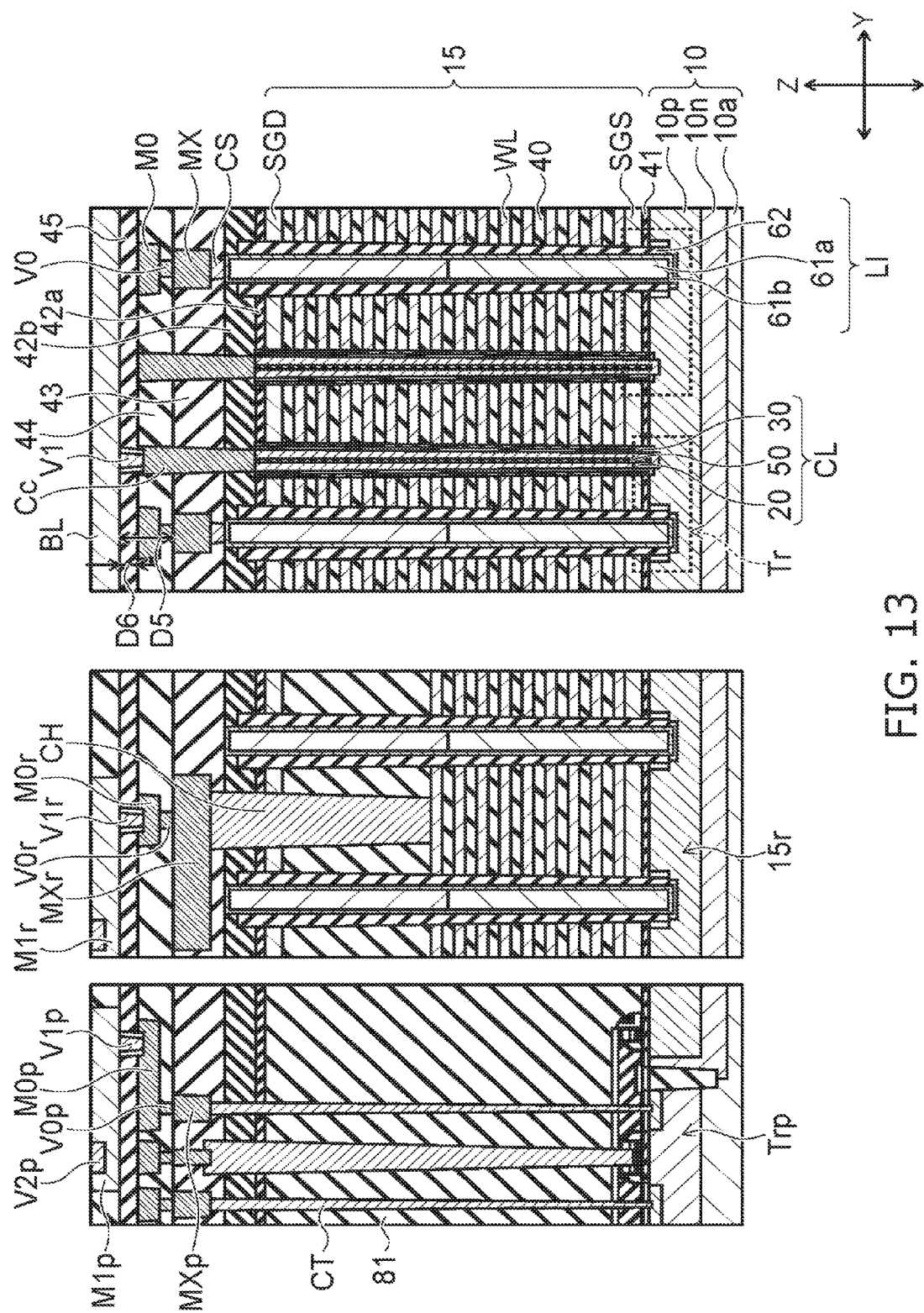
FIG. 13 is a schematic cross-sectional view of the semiconductor memory device of the first embodiment.

Note that, as illustrated in FIG. 13, in the interconnect layer LI, the first portion 61a only may be provided on the inside of the conductive film 61b, for example. The first portion 61a includes, for example, at least any of polysilicon, a stacked film of silicon oxide film and a silicon nitride film, and a stacked film of silicon oxide film. In this case, the conductive film 61b is provided on the upper face of the first portion 61a.

A first contact portion CS is provided on the interconnect layer LI. The first contact portion CS is electrically connected to the interconnect layer LI. The first contact portion CS is connected to the second portion 61c, for example. For example, the conductive film 61b may be provided between the first contact portion CS and the second portion 61c.

A first metal layer MX is provided on the first contact portion CS. The first metal layer MX extends in the X-direction. The first metal layer MX is electrically connected to the interconnect layer LI via the first contact portion CS.

A second contact portion V0 is provided on the first metal layer MX. The second contact portion V0 is electrically connected to the interconnect layer LI via the first metal layer MX.

The second metal layer M0 is provided on the second contact portion V0. The second metal layer M0 extends in the X-direction. The second metal layer M0 is electrically connected to the interconnect layer LI via the second contact portion V0.

Each of the contact portions CS, V0 and each of the metal layers MX, M0 may include the same material, for example, or may each include different materials. Each of the contact portions CS, V0 and each of the metal layers MX, M0 include, for example, tungsten.

In the Y-direction, the width D2 of the first metal layer MX is wider than the width D1 of the first contact portion CS and the width D3 of the second contact portion V0. Also, the width D4 of the second metal layer M0 is wider than the width D1 of the first contact portion CS and the width D3 of the second contact portion V0.

The third contact part Cc is provided on the columnar portion CL. The third contact part Cc is electrically connected to the channel body 20.

The height of the upper face of the third contact part Cc is higher than the upper face of the first metal layer MX. The height of the lower face of the third contact part Cc is lower than the upper face of the interconnect layer LI. Note that, here "height" indicates the position in the Z-direction.

A fourth contact part V1 is provided on the third contact part Cc. The fourth contact part V1 is electrically connected to the channel body 20 via the third contact part Cc.

The bit lines BL are provided on the fourth contact part V1. The bit lines BL are electrically connected to the channel body 20 via the third contact part Cc and the fourth contact part V1.

For example, as illustrated in FIG. 13, the distance D5 between the bit lines BL and the first metal layer MX is larger than the distance D6 between the bit lines BL and the second metal layer M0. In other words, the first metal layer MX is provided between the stacked body 15 and the bit lines BL. The second metal layer M0 is provided between the first metal layer MX and the bit lines BL. The bit lines BL are separated from the first metal layer MX and the second metal layer M0.

The stairs portion 2 is provided on a portion of the substrate 10 separated from the memory cell array 1. A stairs structure 15r of the plurality of electrode layers WL is provided in the stairs portion 2, and a plurality of contact portions CH each in contact with the plurality of electrode layers WL is provided in the stairs portion 2. The plurality of contact portions CH is electrically connected to a plurality of metal layers M1r via each of the plurality of contact portions V0r V1r and each of a plurality of metal layers MXr, M0r.

The plurality of contact portions CH (fifth contact portions) is in contact with the plurality of metal layers MXr, and extends in the Z-direction. The plurality of metal layers MXr (fourth metal layer) is provided on the plurality of contact portions CH. The upper surface of the plurality of metal layers MXr is coplanar with the upper surface of the first metal layer MX.

A plurality of contact portions V0r (fifth contact portions) is in contact with the plurality of metal layers MXr and the plurality of the metal layers M0r, and extends in the Z-direction. The plurality of metal layers M0r (sixth metal layer) is provided on the plurality of contact portions V0r.

The plurality of metal layers M0r is electrically connected to the plurality of metal layers MXr via the plurality of contact portions V0r. The upper face of the plurality of metal layers M0r is coplanar with the upper face of the second metal layer M0.

The plurality of contact portions CH, each of the plurality of contact portions V0r, V1r, and each of the plurality of metal layers MXr, M0r may include the same material, for example, or may each include different materials. The plurality of contact portions CH, each of the plurality of contact portions V0r, V1r, and each of the plurality of metal layers MXr, M0r include, for example, tungsten.

For example, the metal layer M1r of the stairs portion 2 is electrically connected to a metal layer M1p of the peripheral region 3. The metal layer M1p is electrically connected to the transistor Trp via each of contact portions V1p, V0p, CT and each of metal layers M0p, MXp. The transistor Trp is provided on an n-type semiconductor layer 10n of the substrate 10.

The contact portion CT (sixth contact portion) is in contact with the transistor Trp and the metal layer MXp, and extends in the Z-direction. The metal layers MXp (fifth metal layer) is provided on the contact portion CT. The upper surface of the metal layer MXp is coplanar with the upper surface of the first metal layer MX and the plurality of metal layers MXr.

The contact portion V0p (eighth contact portion) is in contact with the metal layer MXp and the metal layer M0p, and extends in the Z-direction. The metal layer M0p (seventh metal layer) is provided on the contact portion V0p.

The metal layer M0p is electrically connected to the metal layer MXp via the contact portion V0p. The upper surface of the metal layer MXp is coplanar with the upper surface of the second metal layer M0 and the upper surface of the plurality of metal layers M0r.

Each of the contact portions CT, V0p, V1p and each of the metal layers MXp, M0p may include the same material, for example, or may each include different materials. Each of the contact portions CT, V0p, V1p and each of the metal layers MXp, M0p include, for example, tungsten.

Figure 4:
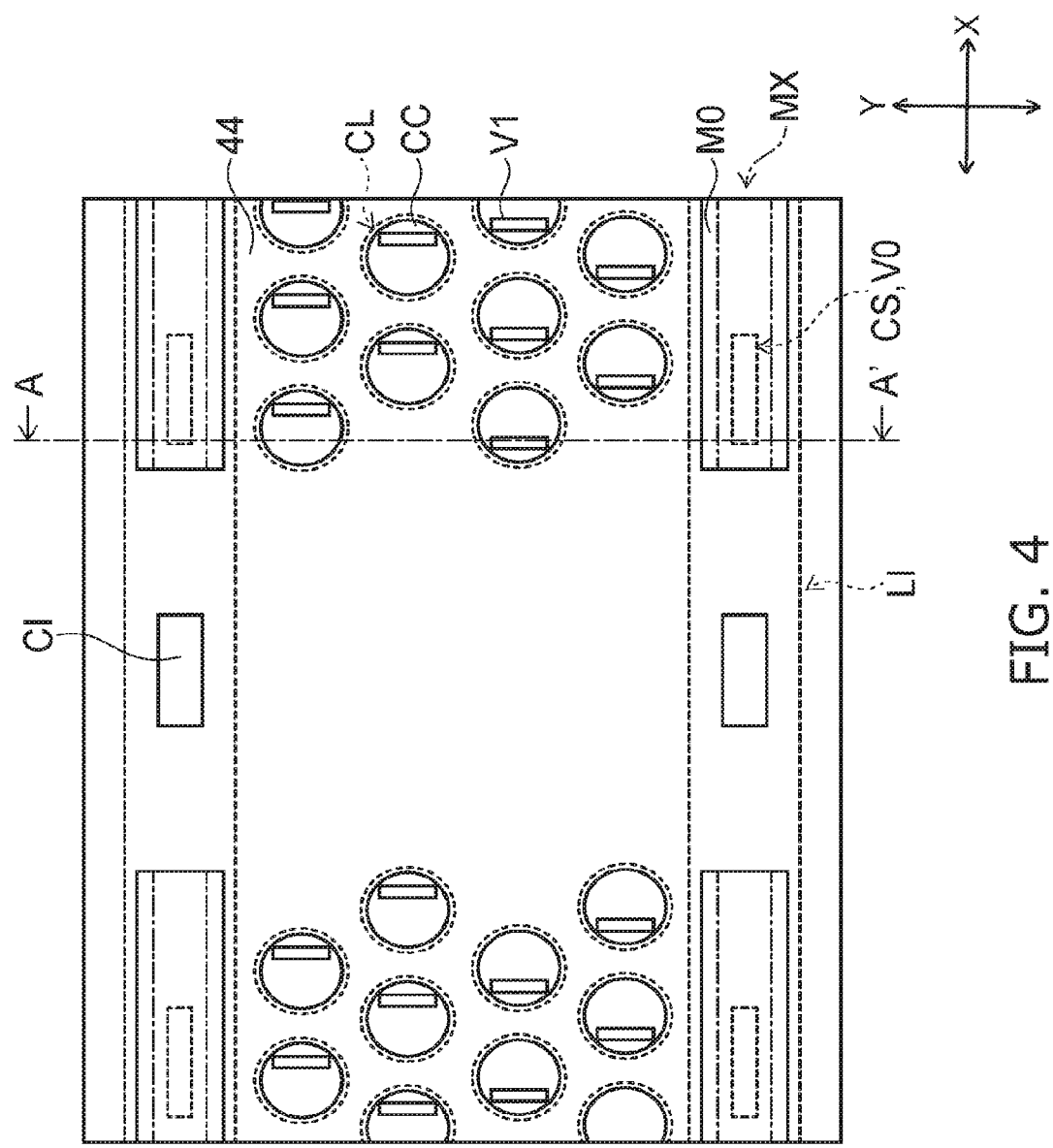
FIG. 4 is a schematic plan view of the semiconductor memory device of the first embodiment.

As illustrated in FIG. 4, the first metal layer MX and the second metal layer M0 extend in the X-direction, overlapping with the interconnect layer LI. Each of the metal layers MX, M0 is separated in the X-direction sandwiching a contact portion CI. In other words, the length that each of the metal layers MX, M0 extends in the X-direction, is shorter than the length that the interconnect layer LI extends. The interconnect layer LI is electrically connected to the source layer SL illustrated in FIG. 1 via the contact portion CI.

When viewed in plan (Z-direction), each of the metal layers MX, M0 is separated from and does not overlap with the columnar portions CL. In the Y-direction, the width of each of the metal layers MX, M0 is optional. In FIG. 4, the width of the second metal layer M0 is wider than the width of the first metal layer MX.

The following is a description of a manufacturing method of a semiconductor memory device of this embodiment with reference to FIGS. 5 to 12. Note that for the configuration as described above, description of the same contents is omitted.

Figure 5:
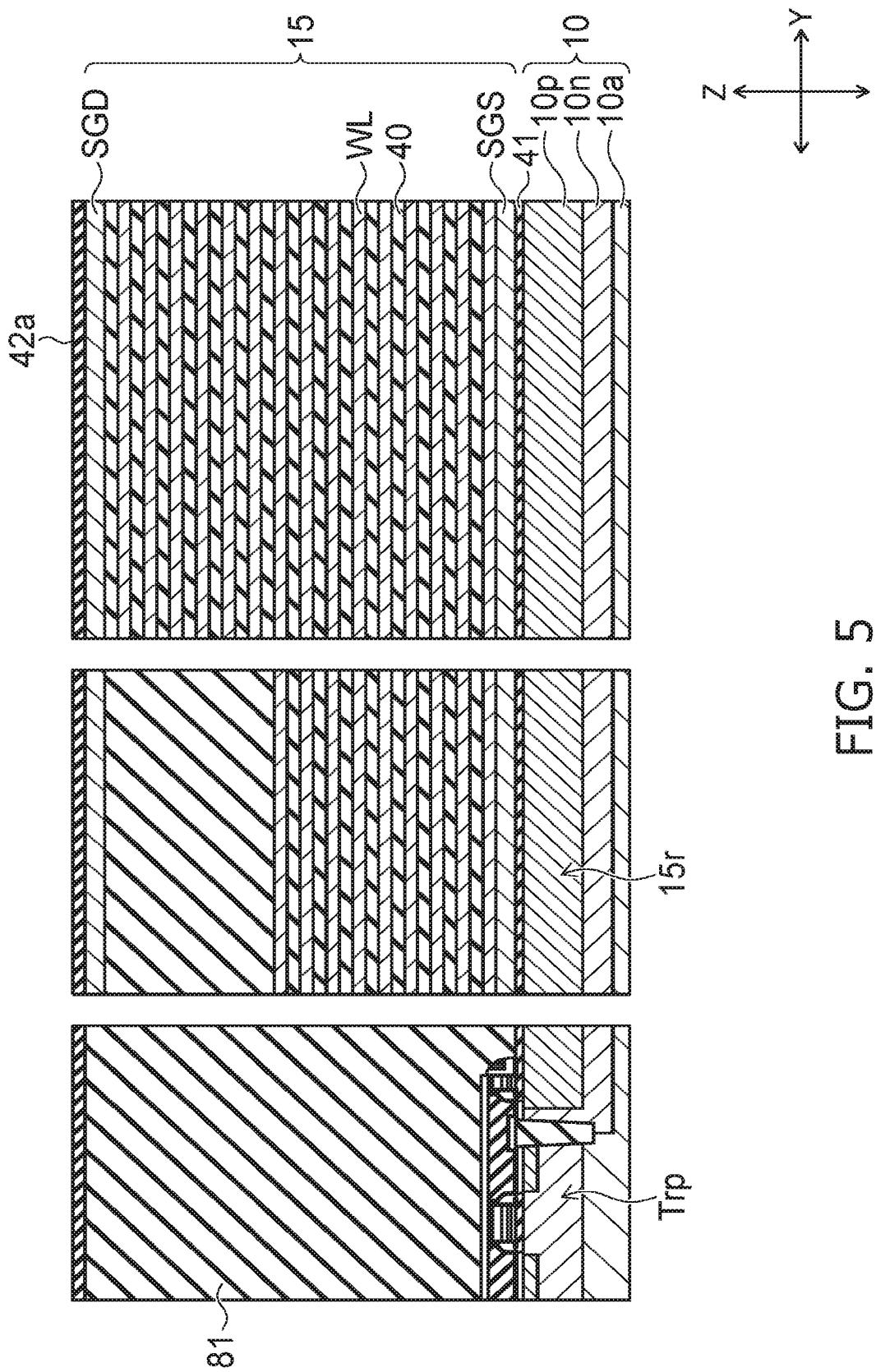
FIG. 5 to FIG. 12 are schematic cross-sectional views showing a method for manufacturing the semiconductor memory device of the first embodiment.

As illustrated in FIG. 5, the substrate 10 includes a base layer 10a, the n-type semiconductor layer 10n, and the p-type semiconductor layer 10p. The n-type semiconductor layer 10n is formed on the base layer 10a. The transistor Trp and the p-type semiconductor layer 10p are formed on the n-type semiconductor layer 10n.

The stacked body 15 is provided on the p-type semiconductor layer 10p with the insulating layer 41 provided therebetween. The stacked body 15 includes the source-side select gate SGS, the drain-side select gate SGD, the plurality of electrode layers WL, and the plurality of insulating layers 40.

The plurality of electrode layers WL, source-side select gate SGS, and the drain-side select gate SGD include for example a metal, or include tungsten. The plurality of insulating layers 40 includes for example silicon, or includes a silicon oxide film.

The source-side select gate SGS is formed on the insulating layer 41. Each of the plurality of electrode layers WL is stacked separated from each other on the source-side select gate SGS. The insulating layer 40 is formed between the plurality of electrode layers WL. The drain-side select gate SGD is formed on the uppermost layer of the electrode layers WL with the insulating layer 40 provided therebetween.

The stacked body 15 includes the stairs structure 15r. The stairs structure 15r is, for example, formed between the stacked body 15 and the transistor Trp. An insulating film 81 is formed on the upper face of the stairs structure 15r and the upper face of the transistor Trp. An insulating layer 42a is formed on the stacked body 15 and on the insulating film 81.

Figure 6:
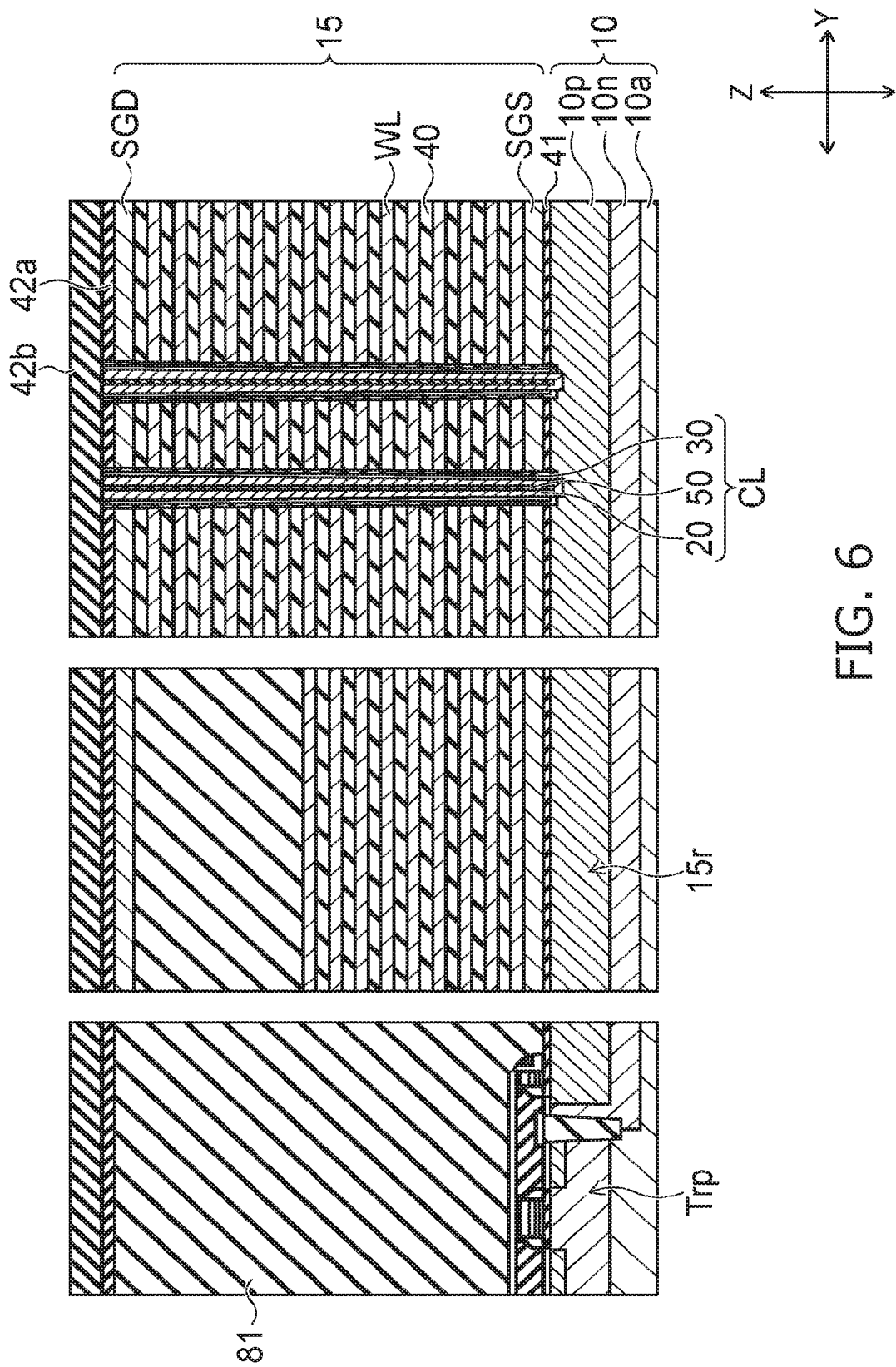

As illustrated in FIG. 6, the columnar portions CL are formed in the stacked body 15 extending in the stacking direction (Z-direction). Each of the films illustrated in FIG. 2 is formed in the columnar portions CL. The lower end of the channel body 20 in the columnar portion CL is in contact with the substrate 10. An insulating layer 42b is formed on the insulating layer 42a and the columnar portions CL.

Figure 7:
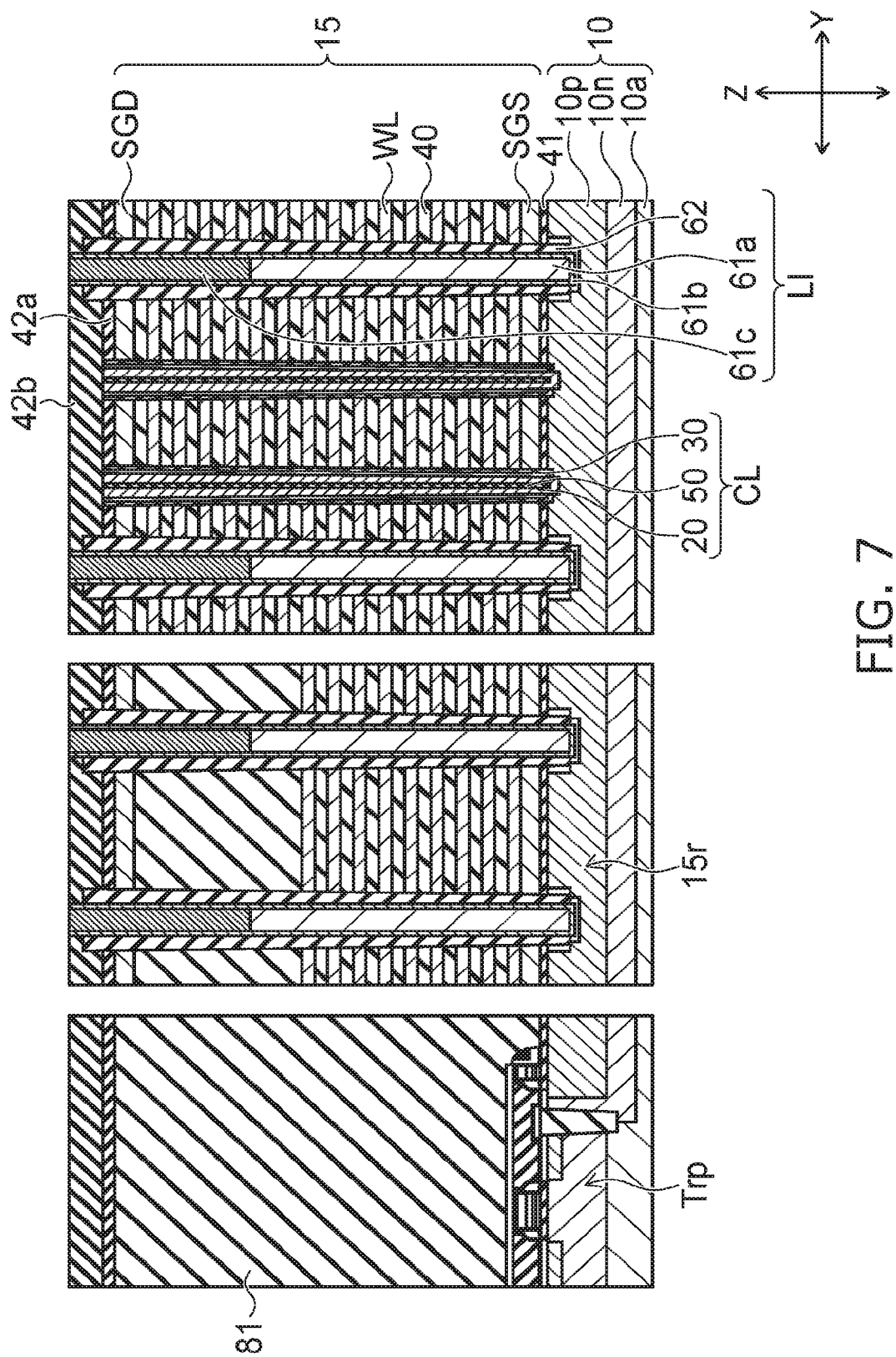

As illustrated in FIG. 7, the interconnect layer LI is formed extending in the Z-direction and the X-direction in the stacked body 15 and in the stairs structure 15r. The insulating film 62 is formed on a side face of the interconnect layer LI. The insulating film 62 is in contact with the stacked body 15. The conductive film 61b is formed on the inner side of the insulating film 62. The conductive film 61b is formed, for example, on the lower face of the interconnect layer LI, and is in contact with the substrate 10.

The first portion 61a and the second portion 61c are formed on the inside of the conductive film 61b. The second portion 61c is formed on the first portion 61a. For example, the conductive film 61b may be formed between the first portion 61a and the second portion 61c, and may be formed in contact with the upper face of the second portion 61c. For example, as illustrated in FIG. 13, the first portion 61a only may be formed on the inside of the conductive film 61b, without forming the second portion 61c.

Figure 8:
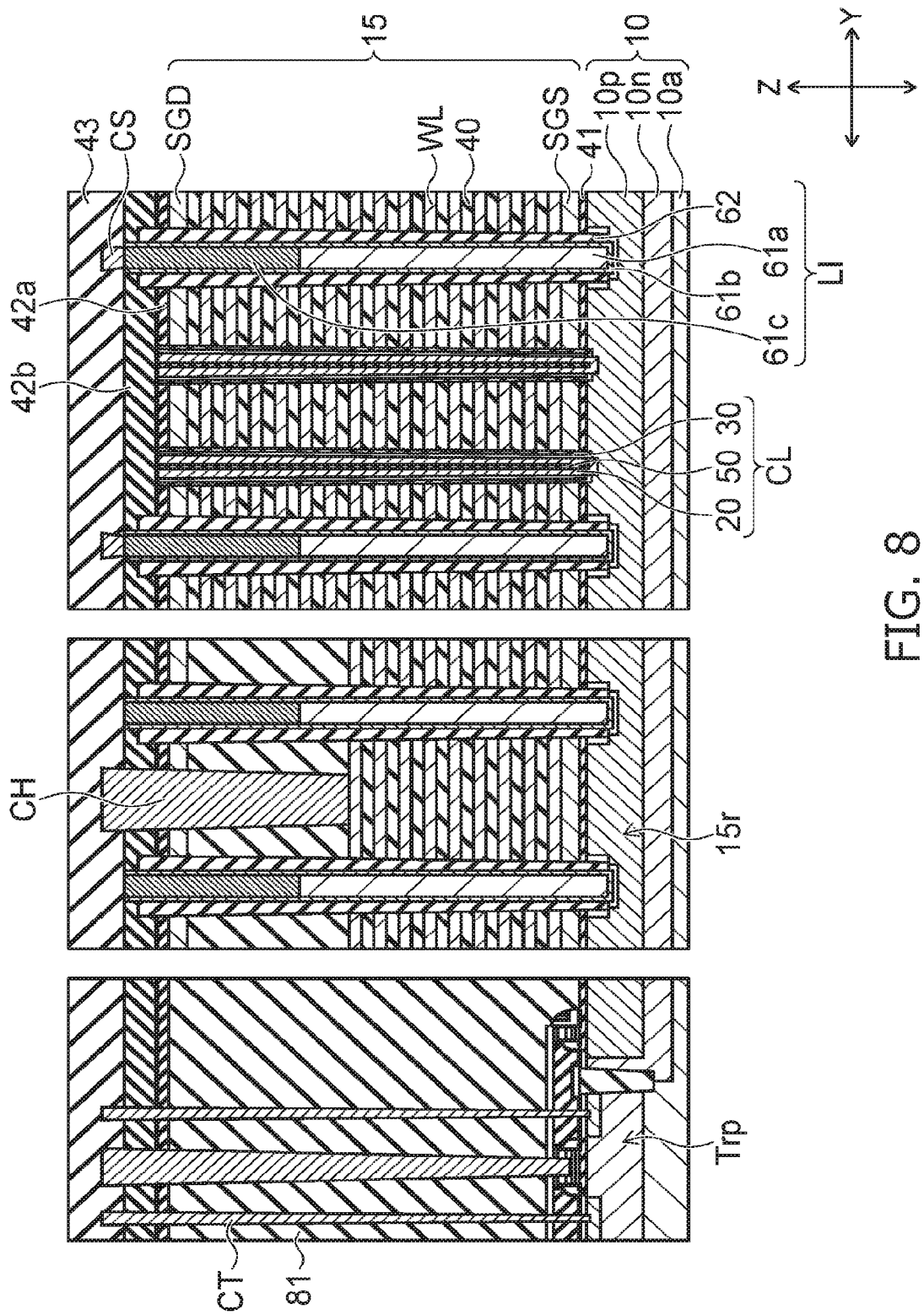

As illustrated in FIG. 8, the first contact portion CS is formed on the interconnect layer LI formed in the stacked body 15. The first contact portion CS is electrically connected to the interconnect layer LI.

Simultaneously with forming the first contact portion CS, the contact portion CH is formed on the stairs structure 15r. A plurality of contact portions CH is formed. The plurality of contact portions CH is electrically connected to the plurality of electrode layers WL.

Also, simultaneously with forming the first contact portion CS and the contact portion CH, the contact portion CT may be formed on the transistor Trp. The contact portion CT is electrically connected to the transistor Trp. The insulating layer 43 is formed on the insulating layer 42b and on each of the contact portions CS, CH, CT.

Figure 9:
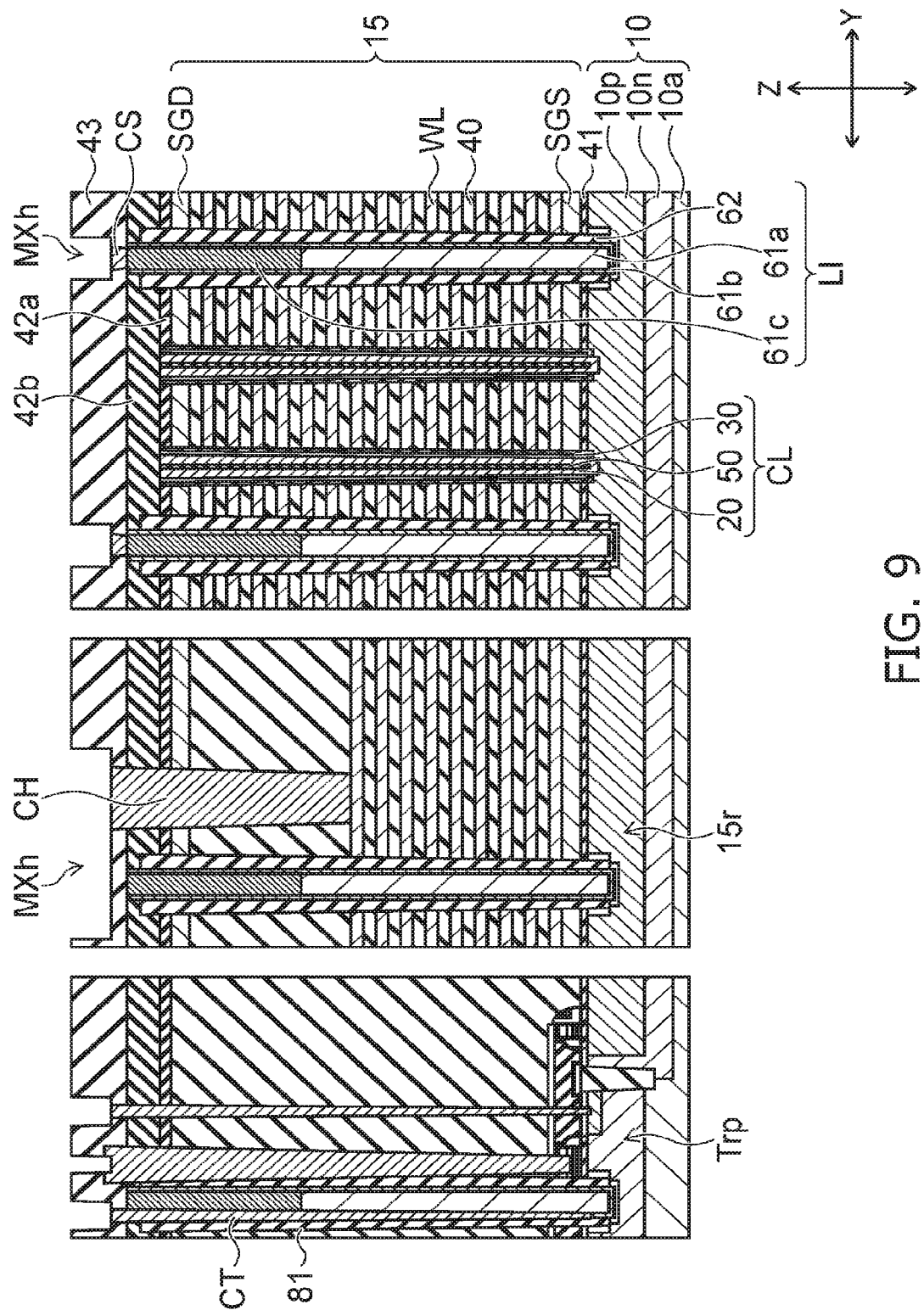

As illustrated in FIG. 9, spaces MXh that pass through the insulating layer 43 and reach each of the contact portions CS, CH, CT are formed simultaneously. The spaces MXh extend in the X-direction. Each of the contact portions CS, CH, CT is exposed on the lower face of the spaces MXh. As stated above, each of the contact portions CS, CH, CT is formed simultaneously, and the upper faces of each of the contact portions CS, CH, CT are formed coplanar. Therefore, the spaces MXh formed on each of the contact portions CS, CH, CT can be formed simultaneously.

Figure 10:
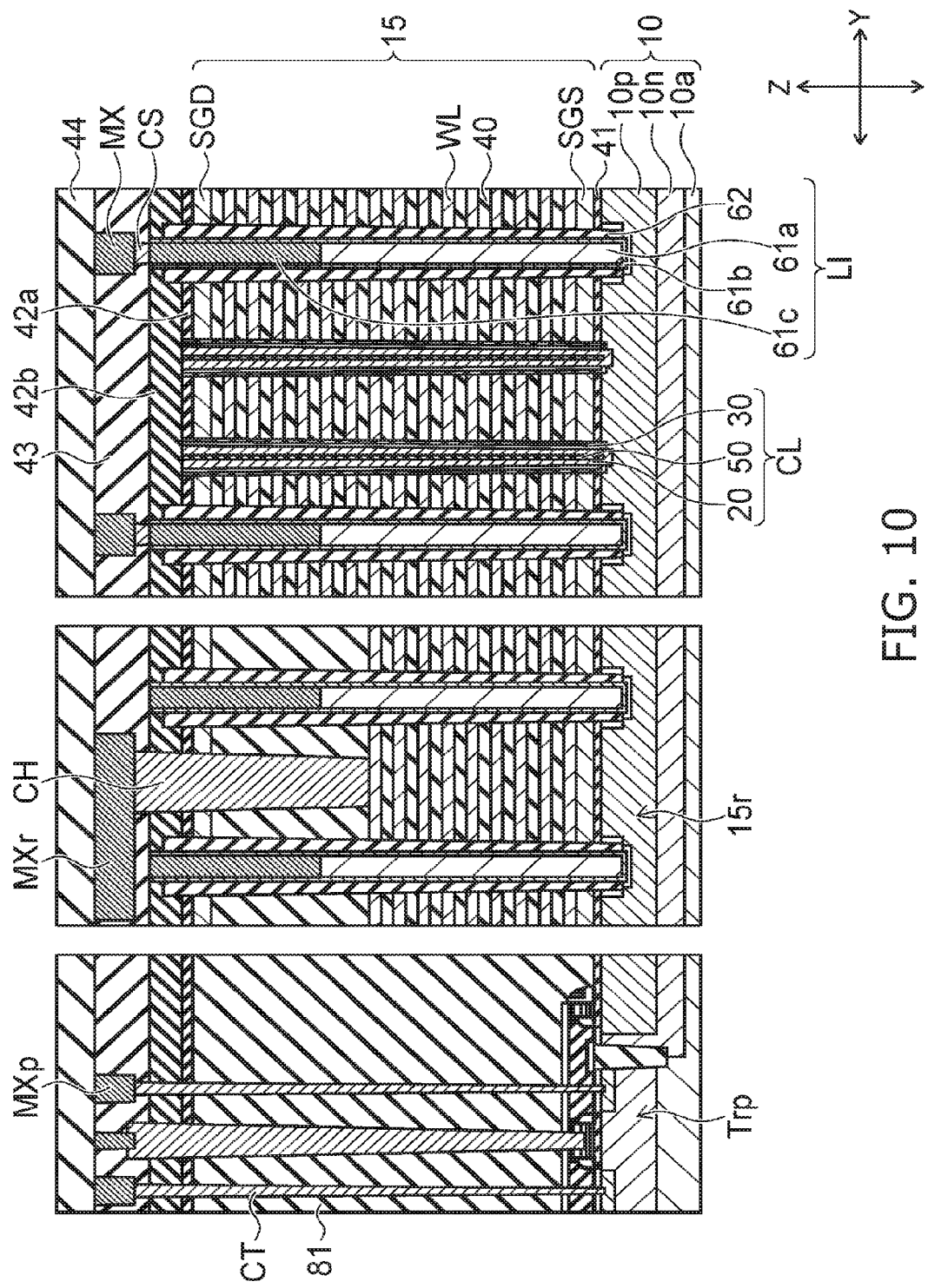

As illustrated in FIG. 10, the first metal layer MX is formed in the space MXh extending in the X-direction. The first metal layer MX is electrically connected to the interconnect layer LI via the first contact portion CS. For example, the resistance of the first metal layer MX is lower than the resistance of the interconnect layer LI.

Simultaneously with forming the first metal layer MX, the metal layers MXr, MXp are formed. The metal layer MXr is electrically connected to the electrode layer WL via the contact portion CH. The metal layer MXp is electrically connected to the transistor Trp via the contact portion CT. The insulating layer 44 is formed on each of the metal layers MX, MXr, MXp and on the insulating layer 43.

Thereafter, the unnecessary metal layer formed on the insulating layer 43 is removed, associated with the formation of each of the metal layer MX, MXr, MXp. For example the chemical mechanical polishing method (CMP method) is used as the method for removing the unnecessary metal layer. Each of the metal MX, MXr, MXp is formed simultaneously, so the unnecessary metal layer is removed once.

Figure 11:
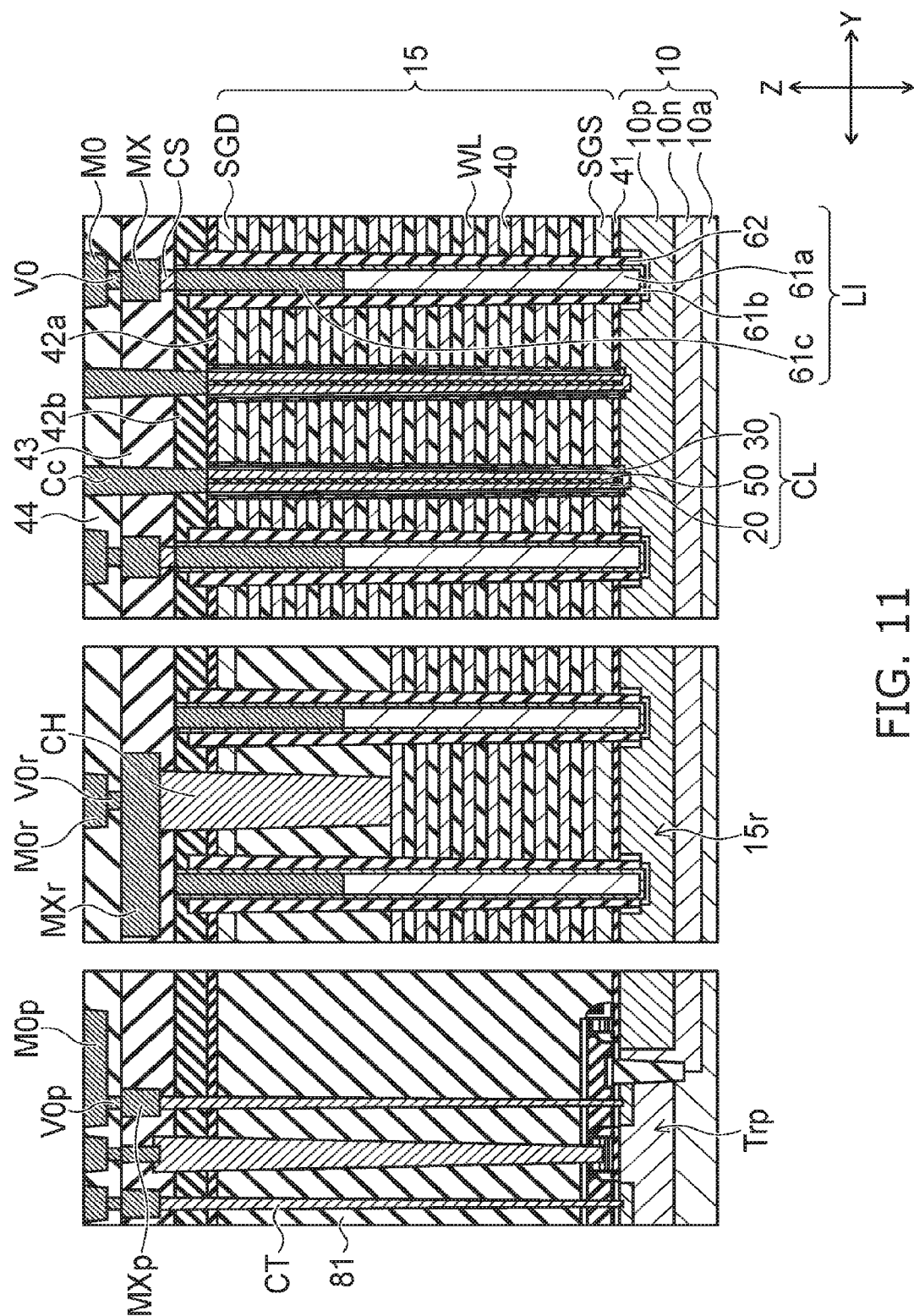

As illustrated in FIG. 11, the second contact portion V0 is formed on the first metal layer MX. The second contact portion V0 is electrically connected to the interconnect layer LI via the first metal layer MX.

Simultaneously with forming the second contact portion V0, the third contact part Cc is formed on the columnar portion CL. The third contact part Cc is electrically connected to the channel body 20.

Simultaneously with forming the second contact portion V0 and the third contact part Cc, the contact portion V0r is formed on the metal layer MXr, and a contact portion V0p is formed on the metal layer MXp. The contact portion V0r is electrically connected to the electrode layer WL via the metal layer MX. The contact portion V0p is electrically connected to the transistor Trp via the metal layer MXp.

The second metal layer M0 is formed on the second contact portion V0 extending in the X-direction. The second metal layer M0 is electrically connected to the interconnect layer LI via the second contact portion V0.

Simultaneously with forming the second metal layer M0, the metal layer M0r is formed on the contact portion V0r, and the metal layer M0p is formed on the contact portion V0p. The metal layer M0r is electrically connected to the electrode layer WL via the contact portion V0r. The metal layer M0p is electrically connected to the transistor Trp via the contact portion V0p.

Figure 12:
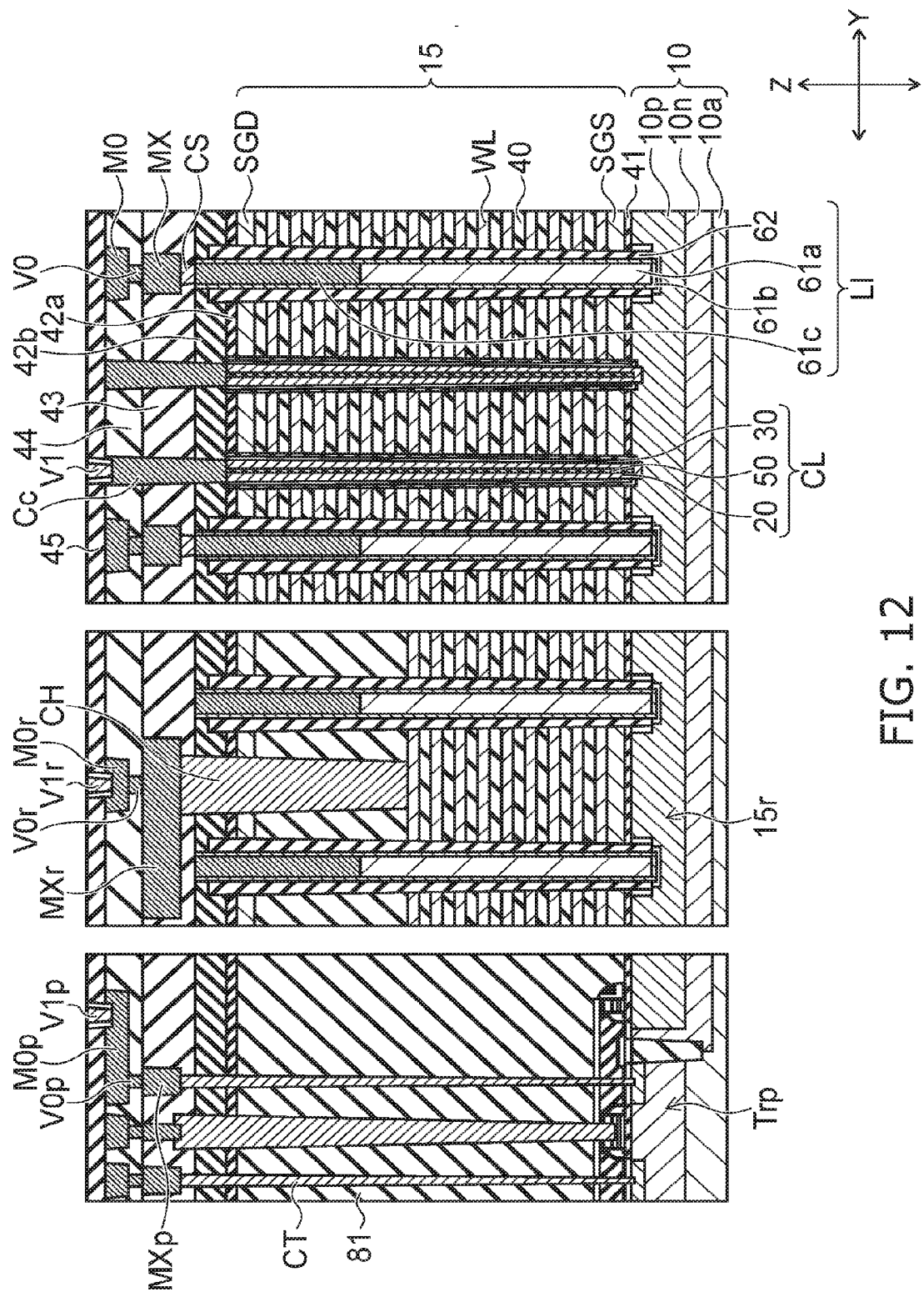

As illustrated in FIG. 12, the insulating layer 45 is formed on each of the metal layers MX, MXr, MXp and on the insulating layer 44. Then, the fourth contact part V1 is formed on the third contact part Cc. The fourth contact part V1 is electrically connected to the channel body 20 via the third contact part Cc.

Simultaneously with forming the fourth contact part V1, the contact portion V1r is formed on the metal layer M0r, and the contact portion V1p is formed on the metal layer M0p. The metal layer M0r is electrically connected to the electrode layer WL via the contact portion V1r. The metal layer M0p is electrically connected to the transistor Trp via the contact portion V1p.

Then, the bit lines BL, the metal layers M1r, M1p, and the like illustrated in FIG. 3 are formed, to form the semiconductor memory device of this embodiment.

The effects of this embodiment will be described.

According to this embodiment, the first metal layer MX is provided on the interconnect layer LI, and the second metal layer M0 is provided on the first metal layer MX. The interconnect layer LI is electrically connected to the first metal layer MX and the second metal layer M0. The interconnect layer LI includes the first portion 61a including silicon. In this way, the stress can be relaxed regardless of the increase in number of layers of the stacked body 15, so degradation of the device can be suppressed.

For example, consider a case in which the interconnect layer LI has a configuration in which a metal (for example, tungsten) only is embedded. In this case, there is a possibility of failure, peeling, cracking, or twisting of the stacked body, or warping of the wafer, and the like, caused by stresses in the interconnect layer LI. As a result, there is a concern over degradation of the device. The potential for degradation of the device as described above increases as the number of layers of the stacked body 15 increases.

In contrast, according to this embodiment, the interconnect layer LI includes the first portion 61a including silicon. In this way, the stress caused by the interconnect layer LI as described above can be relaxed, so degradation of the device can be suppressed.

For example, if silicon is used instead of metal in the interconnect layer LI, the resistance in the X-direction of the interconnect layer LI may be greatly increased.

In contrast, according to this embodiment, the first metal layer MX and the second metal layer M0 are provided on the interconnect layer LI. The interconnect layer LI is electrically connected to the first metal layer MX and the second metal layer M0. In this way, it is possible to reduce the resistance in the X-direction of the interconnect layer LI. Therefore, the increase in resistance of the interconnect layer LI is suppressed, and, stresses can be relaxed. In other words, degradation of the device can be suppressed.

For example, as the number of layers of the stacked body 15 increases, the distance between the lower side of the stacked body 15 and each of the metal layers MX, M0 increases. As a result, there is a possibility that the resistance of the interconnect layer LI may increase in the stacking direction (Z-direction).

In contrast, according to this embodiment, the second portion 61c having electrical conductivity is provided on the first portion 61a, for example. In the Z-direction, the thickness T1 of the first portion 61a is thicker than the thickness T2 of the second portion 61c. As a result, as the number of layers of the stacked body 15 increases, the thickness T1 of the first portion 61a and the thickness T2 of the second portion 61c can be controlled. Therefore, the increase in resistance of the interconnect layer LI is suppressed, and stresses can be relaxed. In other words, degradation of the device can be suppressed.

Also, the conductive film 61*b* is provided between the first portion 61*a* and the stacked body 15. Therefore, the increase in resistance of the interconnect layer LI is suppressed, and stresses can be relaxed, regardless of the increase in the number of layers of the stacked body 15. In other words, degradation of the device can be suppressed.

For example, consider a case in which the second metal layer M0 only is provided on the interconnect layer LI, and the first metal layer MX is not provided. In this case, parasitic capacitance and the like are generated between the second metal layer M0 and the bit line BL, which can cause degradation of the device.

In contrast, according to this embodiment, the first metal layer MX is provided between the interconnect layer LI and the second metal layer M0. The distance D5 between the bit lines BL and the first metal layer MX is larger than the distance D6 between the bit lines BL and the second metal layer M0. As a result, the parasitic capacitance between the second metal layer M0 and the lines BL can be suppressed. In other words, degradation of the device can be suppressed.

In addition, according to this embodiment, the contact portions CH, CT can be formed simultaneously with forming the first contact portion CS. Simultaneously with forming the first metal layer MX, the metal layers MXr, MXp can be formed. Also, the unnecessary metal layer can be removed at once simultaneously with forming each of the metal layers MX, MXr, MXp. Simultaneously with forming the second contact portion V0, the third contact part Cc and the contact portions V0*r*, V0*p* can be formed. Simultaneously with forming the second metal layer M0, the metal layers M0*r*, M0*p* can be formed. As a result, the semiconductor memory device according to this embodiment can be formed without increasing the number of operations.

Note that, the wafer as described above refers to, for example, the substrate 10 prior to dicing into multiple semiconductor memory devices.

Second Embodiment

Next, a configuration of a semiconductor memory device of this embodiment will be described with reference to FIGS. 14 to 15B.

Figure 14:
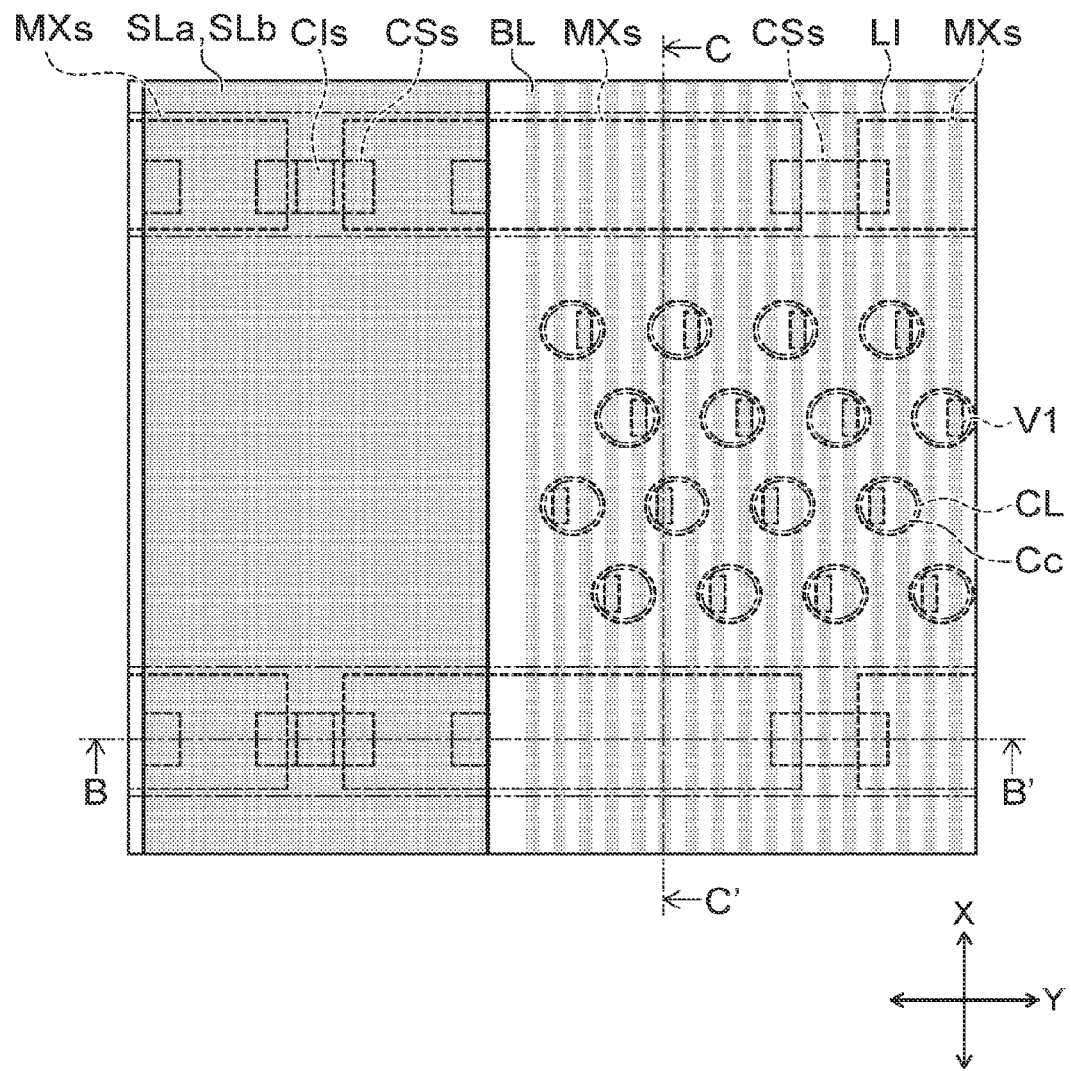
FIG. 14 is a schematic plan view of the semiconductor memory device of second embodiment.

FIG. 14 is a schematic plan view of the semiconductor memory device according to this embodiment.

FIGS. 15A and 15B are schematic cross-sectional views of the semiconductor memory device according to this embodiment. The schematic cross-sectional view of the semiconductor memory device of FIG. 15A corresponds to B-B' of FIG. 14. The schematic cross-sectional view of the semiconductor memory device of FIG. 15B corresponds to C-C' of FIG. 14.

In this embodiment, the main differences from the embodiment described above are in the configuration above the interconnect layer. Therefore, the description of the parts that are the same as the embodiment described above is partially omitted.

As illustrated in FIGS. 14 to 15B, the first metal layer MXs is provided on the interconnect layer LI, and extends in the X-direction. First metal layers MXs are separated in the X-direction sandwiching a first contact portion CSs. In other words, the length that each of the first metal layers MXs extends in the X-direction is shorter than the length that the interconnect layer LI extends.

When viewed from the Z-direction, the first metal layer MXs overlaps with each of the source layers SLa, SLb, and each of the contact portions CIs, CSs. The first metal layer MXs is electrically connected to the interconnect layer LI, each of the source layers SLa, SLb, and the contact portion CIs, via the first contact portion CSs. The first metal layer MXs is separated from the bit lines BL with insulating layers 44, 45 provided therebetween.

The first contact portion CSs is in contact with the side face and the upper face of the first metal layer MXs and the upper face of the interconnect layer LI. The first contact portion CS extends from the upper face of the interconnect layer LI to a position higher than the upper face of the first metal layer MXs, and extends in the X-direction in a position higher than the upper face of the first metal layer MXs.

The first source layer SLa (second metal layer) is in contact with the upper face of the first contact portion CSs, and extends in the Y-direction. The second source layer SLb is electrically connected to the first source layer SLa via a contact portion CIs, and extends in the Y-direction.

Next, a method for manufacturing the semiconductor memory device of this embodiment will be described with reference to FIGS. 16 to 21B. Note that the description of the processes that are the same as the method of manufacturing the stairs portion 2, the peripheral region 3, and the embodiment as described above are omitted.

Figure 16:
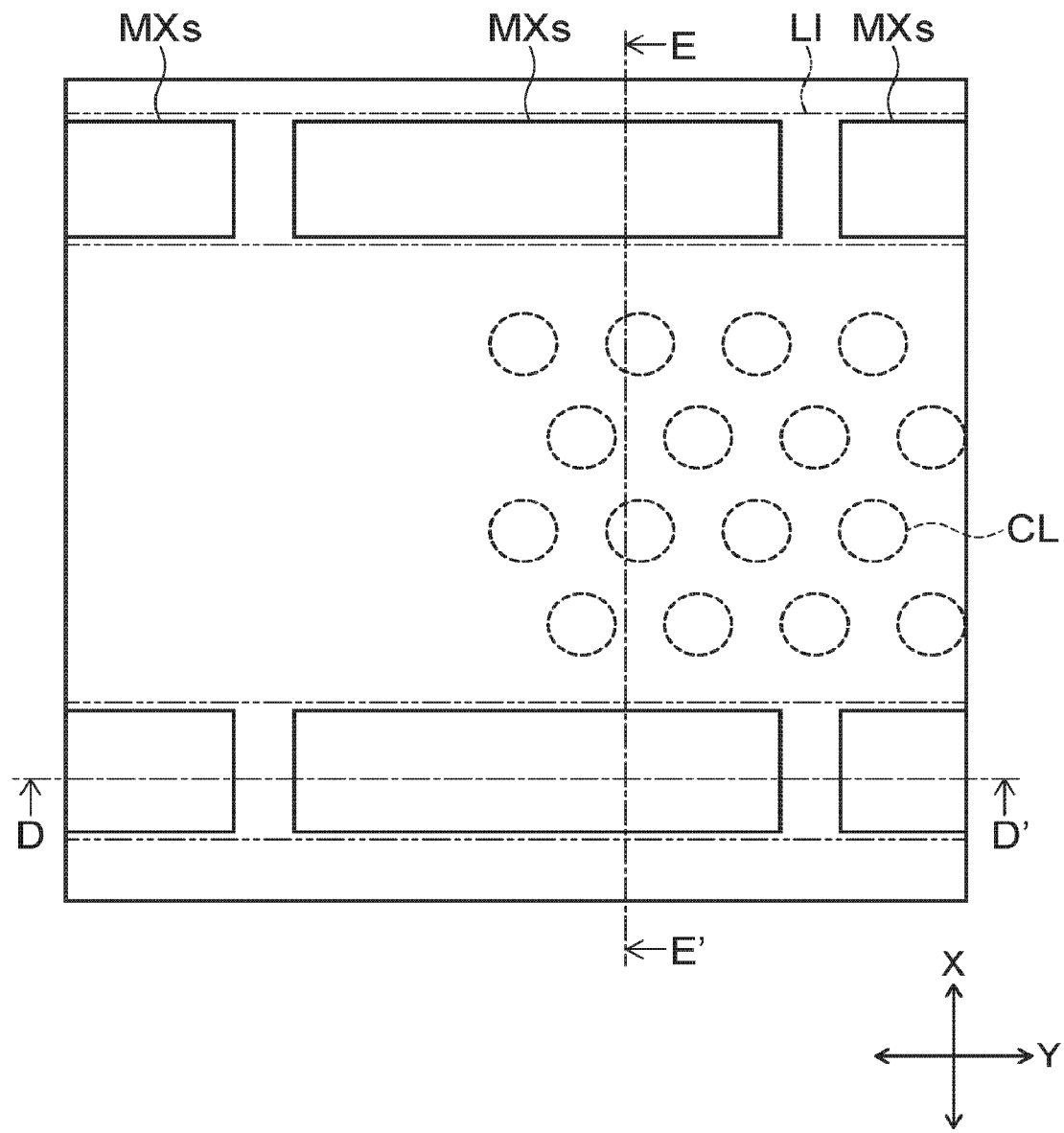
Figure 18:
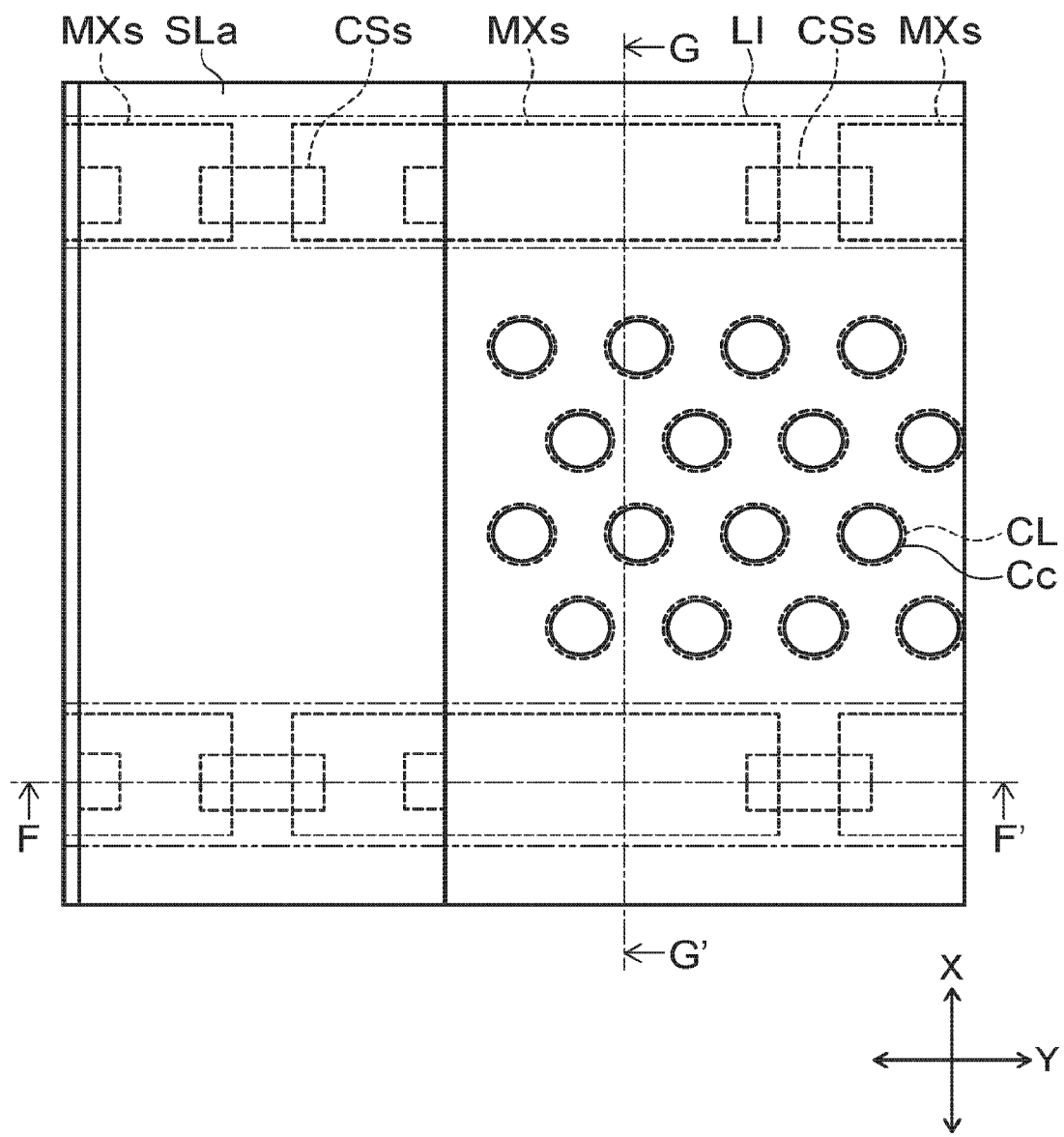
Figure 20:
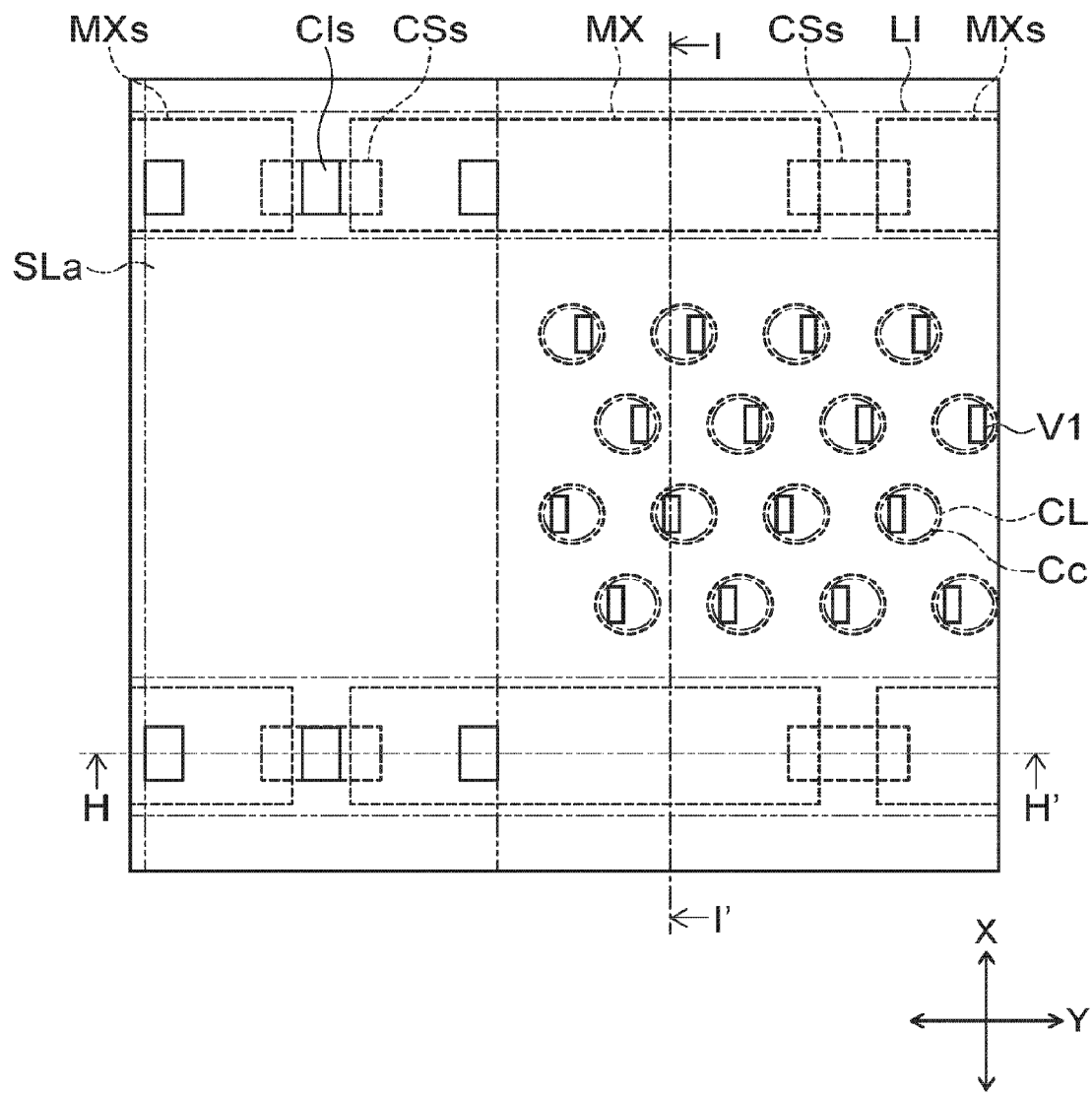

FIGS. 16, 18, and 20 are schematic plan views of the semiconductor memory device according to this embodiment. In FIGS. 16, 18, and 20, the insulating layers 43 to 45 are omitted.

FIGS. 17A, 17B, 19A, 19B, 21A, and 21B are schematic cross-sectional views of the semiconductor memory device according to this embodiment. The schematic cross-sectional views of FIGS. 17A and 17B correspond to D-D' and E-E' of FIG. 16 respectively. The schematic cross-sectional views of FIGS. 19A and 19B correspond to F-F' and G-G' of FIG. 18 respectively. The schematic cross-sectional views of FIGS. 21A and 21B correspond to H-H' and I-I' of FIG. 20 respectively.

Of the method of manufacturing the embodiment as described above, the details illustrated in FIGS. 5 to 7 are the same as this embodiment, so their description is omitted. In other words, the processes until the formation of the interconnect layer LI are the same as those of the embodiment described above.

Figure 17B:
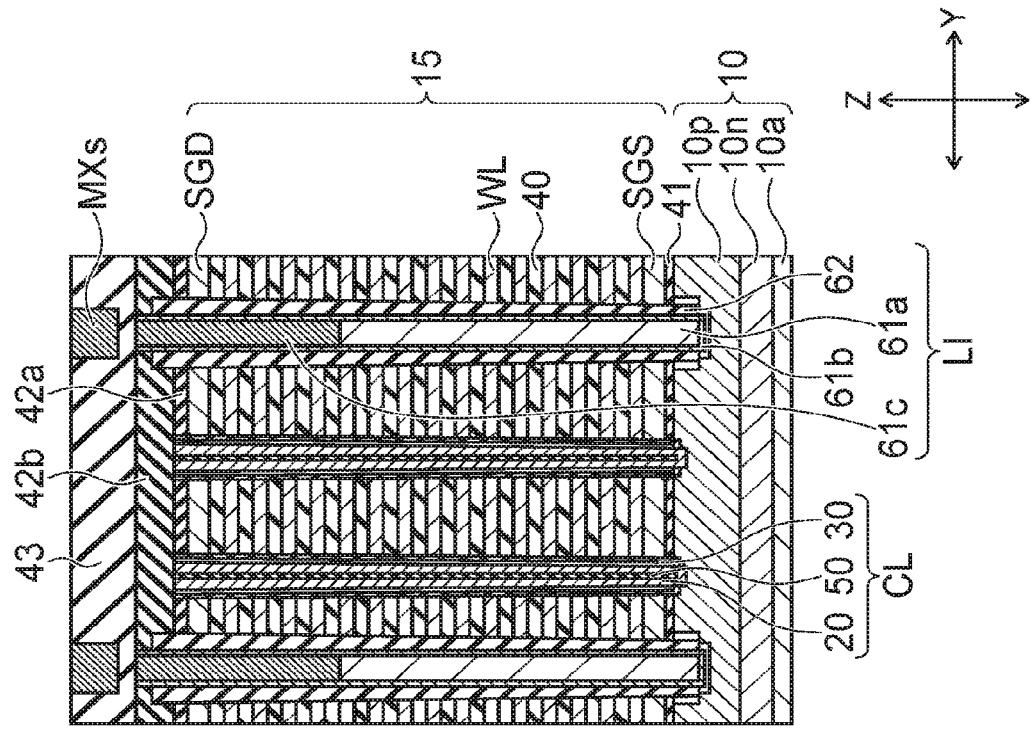
Figure 17A:
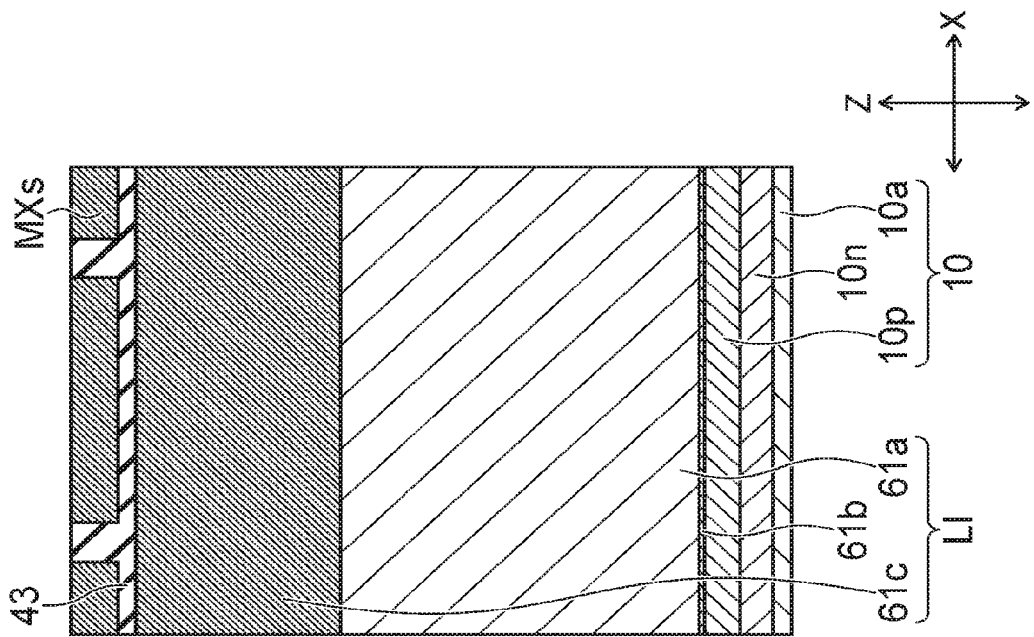

As illustrated in FIGS. 16, 17A, and 17B, the insulating layer 43 is formed on the insulating layer 42*b* and the interconnect layer LI. Then, the first metal layer MXs is formed on the interconnect layer LI with the insulating layer 43 provided therebetween. The first metal layer MXs is formed intermittently in the X-direction.

The first metal layer MXs is formed on the portion where the insulating layer 43 has been partially removed. At this time, the same as for the embodiment as described above, simultaneously with forming the first metal layer MX, the metal layers MXr, MXp may be formed.

As illustrated in FIGS. 18, 19A, and 19B, the insulating layer 44 is formed on the first metal layer MXs. Then, each of the contact portions CSs, the contact parts Cc and the first source layer SLs are formed. The method of forming each of the contact portions CSs, the contact parts Cc, and the first source layer SLs is to first form holes in which each of the contact portions CSs and the contact parts Cc are formed. The contact holes are formed by, for example, photolithography and etching. Then, a groove is formed in which the first source layer SLa will be formed using the same method. Then, for example, metal films are formed in the holes and the groove, and the unnecessary metal layer formed on the insulating layer 44 is removed using the CMP method, for example.

In this way, each of the contact portions CSs, the contact parts Cc, and the first source layer SLs are formed. At this time, simultaneously with forming each of the contact portions CSs, the contact parts Cc, and the first source layer SLs, at least any of the contact portions V0r, V0p and the metal layers M0r, M0p may be formed.

As illustrated in FIGS. 20, 21A, and 21B, the insulating layer 45 is formed on the first source layer SLa, the insulating layer 44, each of the contact portions CSs, and each of the contact parts Cc. Then, the contact portion CI is formed on the first source layer SLa, and the fourth contact part V1 is formed on the third contact part Cc. The contact portion CI is in contact with the first source layer SLa. The fourth contact part V1 is in contact with the third contact part Cc.

At this time, simultaneously with forming each of the contact portions CI and contact parts V1, the contact portions V1r, V1p may be formed.

Then, the bit lines BL, the second source layer SLb, and the like illustrated in FIGS. 14, 15A, and 15B are formed, to form the semiconductor memory device of this embodiment.

The effects of this embodiment will be described.

According to this embodiment, the first metal layer MXs is provided on the interconnect layer LI, the same as in the embodiment described above. The interconnect layer LI is electrically connected to the first metal layer MXs. The interconnect layer LI includes the first portion 61a that includes silicon. In this way, the stress can be relaxed regardless of the increase in number of layers of the stacked body 15, so degradation of the device can be suppressed.

Also, the second portion 61c having electrical conductivity is provided on the first portion 61a, for example. Therefore, the increase in resistance of the interconnect layer LI is suppressed, and stresses can be relaxed. In other words, degradation of the device can be suppressed.

Also, the conductive film 61b is provided between the first portion 61a and the stacked body 15. Therefore, the increase in resistance of the interconnect layer LI is suppressed, and stresses can be relaxed, regardless of the increase in the number of layers of the stacked body 15. In other words, degradation of the device can be suppressed.

Also, simultaneously with forming the first metal layer MXs, the metal layers MXr, MXp can be formed. Simultaneously with forming each of the contact portions CSs, the contact parts Cc, and the first source layer SLs, at least any of the contact portions V0r, V0p and the metal layers M0r, M0p can be formed. As a result, the semiconductor memory device according to this embodiment can be formed without increasing the number of operations.

In addition to the above, according to this embodiment, when viewed from the Z-direction, the first metal layer MXs overlaps with each of the source layers SLa, SLb. As a result, degradation of the device can be suppressed.

For example, by forming the metal layer on the stacked body, dishing can be prevented when using the CMP method. Therefore, there is a possibility that dishing can occur locally when the first metal layer is not formed at a portion overlapping with the source layer.

In contrast, according to this embodiment, the first metal layer MXs is formed at a portion overlapping with each of the source layers SLa, SLb. As a result, local dishing is prevented, and degradation of the device can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
   a conductive member;
   a stacked body provided on the conductive member and including a plurality of electrode layers separately stacked on each other;
   a semiconductor film provided in the stacked body and extending in a stacking direction of the stacked body, the semiconductor film electrically connected to the conductive member;
   a charge storage film provided in the stacked body, the charge storage film provided between the plurality of electrode layers and the semiconductor film;
   an interconnect layer provided in the stacked body, the interconnect layer extending in the stacking direction and in a first direction crossing the stacking direction, and being electrically connected to the semiconductor film via the conductive member, the interconnect layer including:
   a first portion including silicon; and
   a second portion provided on the first portion and including metal;
   a first contact portion provided on the stacked body, and electrically connected to the interconnect layer;
   a first metal layer provided on the first contact portion and extending in the first direction, the first metal layer being electrically connected to the interconnect layer via the first contact portion;
   a second metal layer provided on the first metal layer, and electrically connected to the interconnect layer; and
   a second contact portion electrically connected to the interconnect layer via the first metal layer,
   the second metal layer being provided on the second contact portion and extending in the first direction,
   the second metal layer being electrically connected to the interconnect layer via the second contact portion,
   a width of the first metal layer being wider than a width of the first contact portion and a width of the second contact portion in a second direction crossing the stacking direction and the first direction, and
   a width of the second metal layer being wider than a width of the first contact portion and a width of the second contact portion in the second direction.

2. The device according to claim 1, wherein the interconnect layer includes a conductive film provided integrally between the first portion and the stacked body, and between the first portion and the conductive member, the conductive film being electrically connected to the conductive member.

3. The device according to claim 1, wherein in the stacking direction, a thickness of the first portion is thicker than a thickness of the second portion.

4. The device according to claim 1, wherein the second metal layer extends in the second direction, and the second metal layer is in contact with the first contact portion.

5. A semiconductor memory device, comprising:
   a conductive member;
   a stacked body provided on the conductive member and including a plurality of electrode layers separately stacked on each other;

a semiconductor film provided in the stacked body and extending in a stacking direction of the stacked body, the semiconductor film being electrically connected to the conductive member;
a charge storage film provided in the stacked body, the charge storage film being provided between the plurality of electrode layers and the semiconductor film;
an interconnect layer provided in the stacked body, the interconnect layer extending in the stacking direction and in a first direction crossing the stacking direction, and being electrically connected to the semiconductor film via the conductive member, the interconnect layer including:
 a first portion including silicon; and
 a second portion provided on the first portion and including metal;
a first contact portion provided on the stacked body, and electrically connected to the interconnect layer;
a first metal layer provided on the first contact portion and extending in the first direction, the first metal layer being electrically connected to the interconnect layer via the first contact portion;
a second metal layer provided on the first metal layer, and electrically connected to the interconnect layer;
a second contact portion provided on the stacked body and electrically connected to the semiconductor film;
a third contact portion provided on the second contact portion and electrically connected to the semiconductor film via the second contact portion; and
a third metal layer provided on the third contact portion and extending in a second direction crossing the stacking direction and the first direction, the third metal layer being electrically connected to the semiconductor film via the third contact portion, wherein
the first metal layer is provided between the stacked body and the third metal layer,
the second metal layer is provided between the first metal layer and the third metal layer, and
the third metal layer is separated from the first metal layer and the second metal layer.

6. The device according to claim 5, wherein a distance between the third metal layer and the first metal layer is larger than a distance between the third metal layer and the second metal layer.

7. A semiconductor memory device, comprising:
a conductive member;
a stacked body provided on the conductive member and including a plurality of electrode layers separately stacked on each other;
a semiconductor film provided in the stacked body and extending in a stacking direction of the stacked body, the semiconductor film being electrically connected to the conductive member;
a charge storage film provided in the stacked body, the charge storage film being provided between the plurality of electrode layers and the semiconductor film;
an interconnect layer provided in the stacked body, the interconnect layer extending in the stacking direction and in a first direction crossing the stacking direction, and being electrically connected to the semiconductor film via the conductive member, the interconnect layer including:
 a first portion including silicon; and
 a second portion provided on the first portion and including metal;
a first contact portion provided on the stacked body, and electrically connected to the interconnect layer;
a first metal layer provided on the first contact portion and extending in the first direction, the first metal layer being electrically connected to the interconnect layer via the first contact portion;
a second metal layer provided on the first metal layer, and electrically connected to the interconnect layer;
a second contact portion provided on the stacked body and electrically connected to the semiconductor film;
a third contact portion provided on the second contact portion and electrically connected to the semiconductor film via the second contact portion; and
a third metal layer provided on the third contact portion and extending in a second direction crossing the stacking direction and the first direction, the third metal layer being electrically connected to the semiconductor film via the third contact portion,
wherein a height of an upper face of the third contact part is higher than a height of an upper face of the first metal layer.

8. A semiconductor memory device comprising:
a conductive member;
a stacked body provided on the conductive member and including a plurality of electrode layers separately stacked on each other;
a semiconductor film provided in the stacked body and extending in a stacking direction of the stacked body, the semiconductor film being electrically connected to the conductive member;
a charge storage film provided in the stacked body, the charge storage film being provided between the plurality of electrode layers and the semiconductor film;
an interconnect layer provided in the stacked body, the interconnect layer extending in the stacking direction and in a first direction crossing the stacking direction, and being electrically connected to the semiconductor film via the conductive member, the interconnect layer including:
 a first portion including silicon; and
 a second portion provided on the first portion and including metal;
a first contact portion provided on the stacked body, and electrically connected to the interconnect layer;
a first metal layer provided on the first contact portion and extending in the first direction, the first metal layer being electrically connected to the interconnect layer via the first contact portion;
a second metal layer provided on the first metal layer, and electrically connected to the interconnect layer;
a plurality of second contact portions being in contact with the plurality of electrode layers and extending in the stacking direction;
a plurality of third metal layers provided on the plurality of second contact portions;
a transistor provided on the conductive member;
a third contact portion being in contact with the transistor and extending in the stacking direction; and
a fourth metal layer provided on the third contact portion and being in contact with the third contact portion;
a plurality of fourth contact portions being in contact with the plurality of third metal layers and extending in the stacking direction;
a plurality of fifth metal layers provided on the plurality of fourth contact portions;
a plurality of fifth contact portions being in contact with the fourth metal layer and extending in the stacking direction; and
a sixth metal layer provided on the fifth contact portion, wherein an upper face of the fourth metal layer is coplanar with an upper face of the first metal layer and an upper face of the plurality of fifth metal layers.

9. A semiconductor memory device, comprising:
a conductive member;
a stacked body provided on the conductive member, and including a plurality of electrode layers separately stacked on each other;
a semiconductor film provided in the stacked body and extending in the stacking direction of the stacked body, the semiconductor film electrically connected to the conductive member;
a charge storage film provided in the stacked body, the charge storage film being provided between the plurality of electrode layers and the semiconductor film;
an interconnect layer provided in the stacked body, the interconnect layer extending in the stacking direction and in a first direction crossing the stacking direction, electrically connected to the semiconductor film via the conductive member, the interconnect layer including:
a first portion including silicon; and
a conductive film integrally provided between the first portion and the stacked body, and between the first portion and the conductive member;
a first contact portion provided on the stacked body, and electrically connected to the interconnect layer;
a first metal layer provided on the first contact portion and extending in the first direction, the first metal layer being electrically connected to the interconnect layer via the first contact portion; and
a second metal layer provided on the first metal layer, and electrically connected to the interconnect layer,
the first portion including at least one stacked film selected from the group consisting of a stacked film of a polysilicon film and a silicon oxide film, and a stacked film of a silicon nitride film and a silicon oxide film.

* * * * *